US007235135B2

(12) United States Patent
Miyazaki et al.

(10) Patent No.: US 7,235,135 B2
(45) Date of Patent: *Jun. 26, 2007

(54) SUBSTRATE PROCESSING APPARATUS AND SUBSTRATE PROCESSING METHOD

(75) Inventors: Mitsuru Miyazaki, Tokyo (JP); Seiji Katsuoka, Tokyo (JP); Teruyuki Watanabe, Tokyo (JP); Yasuyuki Motojima, Tokyo (JP)

(73) Assignee: Ebara Corporation, Tokyo (JP)

( * ) Notice: Subject to any disclaimer, the term of this patent is extended or adjusted under 35 U.S.C. 154(b) by 573 days.

This patent is subject to a terminal disclaimer.

(21) Appl. No.: 10/458,184

(22) Filed: Jun. 11, 2003

(65) Prior Publication Data

US 2004/0040131 A1  Mar. 4, 2004

(51) Int. Cl.
*B05C 3/00* (2006.01)
(52) U.S. Cl. ...................... 118/423; 118/429
(58) Field of Classification Search ............ 204/275.1; 134/94.1, 95.1, 200, 902, 104.1, 195; 118/425, 118/423, 73
See application file for complete search history.

(56) References Cited

U.S. PATENT DOCUMENTS 4,053,383 A  10/1977 Dötzer et al.
4,066,515 A * 1/1978 Stoger et al. ............... 205/143
5,930,549 A * 7/1999 Kim et al. ................. 396/611
6,352,623 B1  3/2002 Volodarsky et al.

* cited by examiner

Primary Examiner—Brenda A. Lamb
(74) Attorney, Agent, or Firm—Wenderoth, Lind & Ponack, L.L.P.

(57) ABSTRACT

The present invention relates to a substrate processing apparatus and a substrate processing method suitable for processing a substrate with a plurality of liquids. A substrate processing apparatus comprises a substrate holding device for holding a substrate, a container having an opening portion disposed so that the opening portion is opposed to a surface, to be processed, of the substrate, a driving device for moving the container or the substrate holding device between a position at which the container approaches the substrate or a position at which the substrate enters the container, and a position at which the container is positioned away from the substrate, a first treatment liquid supply device for bringing the surface, to be processed, of the substrate which has approached or entered the container into a first treatment liquid, a covering member for covering the opening portion of the container at the position at which the container is positioned away from the substrate, and a second treatment liquid supply device for bringing the surface, to be processed, of the substrate into a second treatment liquid in a state in which the opening portion of the container is covered with the covering member.

9 Claims, 27 Drawing Sheets

SUBSTRATE PROCESSING APPARATUS AND SUBSTRATE PROCESSING METHOD

BACKGROUND OF THE INVENTION

1. Field of the Invention

The present invention relates to a substrate processing apparatus and a substrate processing method suitable for processing a substrate with a plurality of liquids.

2. Description of the Related Art

As an interconnection forming process of a semiconductor device, there has been used a process of embedding a metal (conductive material) in interconnection grooves and contact holes (so-called damascene process). This process comprises embedding a metal such as aluminum, or, recently, copper or silver, in interconnection grooves and contact holes, which have been formed in an interlayer insulating film, and then removing and planarizing excessive metal by chemical mechanical polishing (CMP).

In cases of these types of interconnections, for example, copper interconnections using copper as an interconnection material, surfaces of the interconnections made of copper are exposed to the outside after the planarization process. In order to prevent thermal diffusion of interconnections (copper), or in order to prevent oxidation of interconnections (copper), for example, when a semiconductor device having a multilayer interconnection structure is subsequently formed by laminating insulating films (oxide films) under an oxidizing atmosphere, there has been considered to selectively cover the exposed surfaces of the interconnections with interconnection protective layers (covering material) made of Co alloy, Ni alloy, or the like. Co alloy, Ni alloy, or the like can be obtained by, for example, electroless plating.

Here, for example, a case as shown in FIG. 10 is assumed. Specifically, a fine recess 212 for an interconnection is formed within an insulating film 210 such as $SiO_2$ deposited on a surface of a substrate W such as a semiconductor wafer, a barrier layer 214 such as TaN is formed on surfaces of the insulating film, then, for example, copper plating is performed to deposit a copper film on the surface of the substrate W to embed the recess 212 with the copper film, thereafter, CMP (chemical mechanical polishing) for planarization is performed on the surface of the substrate W to thus form an interconnection 216 of the copper film in the insulating film 210, and an interconnection protective layer (covering material) 218 of a Co—W—P alloy film is selectively formed on a surface of the interconnection (copper film) 216 to protect the interconnection 216.

There will be described a process of selectively forming such an interconnection protective layer (covering material) 218 of a Co—W—P alloy film on a surface of an interconnection 216 by general electroless plating. First, a substrate W such as a semiconductor wafer which has been subject to a CMP process is immersed in an acidic solution such as $H_2SO_4$ of 0.5 M which has a temperature of, for example, 25° C. for about 1 minute to thus remove a CMP residue or the like, such as copper remaining on the surface of the insulating film 210. Then, after the surface of the substrate W is cleaned with a cleaning liquid such as ultra pure water, the substrate W is immersed in a mixture solution such as a mixture of $PdCl_2$ of 0.005 g/L and HCL of 0.2 ml/L which has a temperature of, for example, 25° C. for about 1 minute to thus attach Pd as a catalyst onto the surface of the interconnection 216 to activate an exposed surface of the interconnection 216. Next, after the surface of the substrate W is cleaned with a cleaning liquid such as ultra pure water, the substrate W is immersed in a solution of $Na_3C_6H_5O_7\cdot2H_2O$ (sodium citrate) of 20 g/L which has a temperature of, for example, 25° C. to thus neutralize the surface of the interconnection 216. Then, after the surface of the substrate W is rinsed with ultra pure water, the substrate W is immersed in a Co—W—P plating solution having a temperature of, for example, 80° C. for about 120 seconds to thus perform electroless plating (electroless Co—W—P cover plating) selectively on the activated surface of the interconnection 216, and then the surface of the substrate W is cleaned with a cleaning liquid such as ultra pure water. Thus, an interconnection protective layer 218 of a Co—W—P alloy film is selectively formed on the surface of the interconnection 216 to protect the interconnection 216.

Incidentally, among the above processes, a process of cleaning the substrate W with a cleaning liquid after immersing the substrate in an acidic solution such as $H_2SO_4$, a process of cleaning the substrate W with a cleaning liquid after immersing the substrate in a mixture solution such as a mixture of $PdCl_2$ and HCL, and a process of cleaning the substrate W with a cleaning liquid after immersing the substrate in the solution such as sodium citrate have been performed with a pretreatment unit 240, as shown in FIG. 11, comprising a chemical liquid chamber 250, a cleaning chamber (rinsing chamber) 255, a substrate holding device (substrate holding means) 261 for holding a substrate on a lower surface thereof, and an arm 265 for swingably supporting the substrate holding device 261. The substrate holding device, which has held a substrate on the lower surface thereof, is moved right above the chemical liquid chamber 250 and lowered to attach a chemical liquid onto a lower surface of the substrate, and a chemical liquid treatment is performed while the substrate holding device is being rotated. Next, after the substrate is lifted right above the chemical liquid chamber 250, the arm 265 is swung to move the substrate holding device 261 right above the cleaning chamber 255 and lowered, and the chemical liquid attached onto the lower surface of the substrate is cleaned while the substrate is being rotated and a cleaning liquid is being ejected. Next, after the substrate is lifted right above the cleaning chamber 255, the arm 265 is swung to deliver the substrate to the next process.

However, in the above conventional pretreatment unit 240, since it is necessary to provide two treatment chambers for a chemical liquid treatment and for a cleaning process, not only does an area for installing the apparatus increase so as to occupy a large space, but also the cost of the apparatus increases because a swinging mechanism for the arm 265 is required. These problems are also applicable to a plating unit having a plating chamber and a cleaning chamber.

SUMMARY OF THE INVENTION

The present invention has been made in view of the above, and it is an object of the present invention to provide a substrate processing apparatus and a substrate processing method which can reliably perform treatment of a substrate with a plurality of liquids without mixing the liquids and simultaneously can achieve a smaller area for installing the apparatus and a lower cost of the apparatus.

In order to achieve the above object, a substrate processing apparatus according to the present invention is characterized by comprising a substrate holding device for holding a substrate; a container having an opening portion disposed so that the opening portion is opposed to a surface, to be processed, of the substrate; a driving device for moving the container or the substrate holding device between a position at which the container approaches the substrate or a position at which the substrate enters the container, and a position at which the container is positioned away from the substrate; a first treatment liquid supply device for bringing the surface, to be processed, of the substrate, which has approached or entered the container, into a first treatment liquid; a covering member for covering the opening portion of the container at the position at which the container is positioned away from the substrate; and a second treatment liquid supply device for bringing the surface, to be processed, of the substrate into a second treatment liquid in a state in which the opening portion of the container is covered with the covering member.

Since the surface, to be processed, of the substrate is brought into contact with the second treatment liquid in a state in which the opening portion of the container is covered with the covering member, the second treatment liquid is not introduced into the container and is prevented from being mixed with the first treatment liquid when the substrate is processed with the second treatment liquid. Further, treatment with a plurality of treatment liquids can be performed without moving the substrate holding device.

According to one aspect of the present invention, the second treatment liquid supply device is a second treatment liquid ejecting device mounted on the covering member.

With this arrangement, the second treatment liquid supply device can be mounted integrally with the covering member to simplify the apparatus.

According to one aspect of the present invention, a second container for holding the second treatment liquid supplied to the surface, to be processed, of the substrate from the second treatment liquid supply device is provided around the container.

With this arrangement, the second treatment liquid is not scattered out of the apparatus and can be reused.

According to one aspect of the present invention, the first treatment liquid supply device is a first treatment liquid ejecting device for ejecting the first treatment liquid toward the surface, to be processed, of the substrate from a nozzle provided in the container, or a first treatment liquid holding device for storing the first treatment liquid in the container and immersing the surface, to be processed, of the substrate in the first treatment liquid.

With the first treatment liquid supply device thus constructed, treatment of the surface, to be processed, of the substrate can be performed by spraying a treatment liquid or immersion in a treatment liquid.

According to one aspect of the present invention, the first treatment liquid is a pretreatment liquid for plating, a plating liquid, or a posttreatment liquid for plating.

According to one aspect of the present invention, the second treatment liquid is a cleaning liquid for cleaning the first treatment liquid, which has been brought into contact with the surface, to be processed, of the substrate.

According to one aspect of the present invention, a swinging device for swingably driving the covering member is provided on the covering member; and on the other hand, the driving device is a mechanism for moving the container, and is arranged as a mechanism for stopping the container at three positions including a first position at which the container approaches the substrate or the substrate enters the container, a second position at which the container is positioned away from the substrate and is covered with the covering member, and a third position at which the container is further lowered.

A substrate processing method according to the present invention is characterized by comprising providing a substrate holding device for holding a substrate, and a container having an opening portion disposed so that the opening portion is opposed to a surface, to be processed, of the substrate; bringing the surface, to be processed, of the substrate into a first treatment liquid by moving the container or the substrate holding device to a position at which the surface, to be processed, of the substrate approaches the container or a position at which the surface, to be processed, of the substrate enters the container; and bringing the surface, to be processed, of the substrate into a second treatment liquid in a state in which the opening portion of the container is covered with a covering member after the container is positioned away from the substrate by moving the container or the substrate holding device.

According to one aspect of the present invention, the second treatment liquid is ejected toward the surface, to be processed, of the substrate from a second treatment liquid mounted on the covering member.

According to one aspect of the present invention, the second treatment liquid, which has been brought into contact with the surface, to be processed, of the substrate, is recovered by a second container provided around the container.

According to one aspect of the present invention, the bringing the surface, to be processed, of the substrate into a first treatment liquid comprises ejecting the first treatment liquid toward the surface, to be processed, of the substrate from a nozzle provided in the container, or immersing the surface, to be processed, of the substrate in the first treatment liquid stored in the container.

According to one aspect of the present invention, the first treatment liquid is a pretreatment liquid for plating, a plating liquid, or a posttreatment liquid for plating.

According to one aspect of the present invention, the second treatment liquid is a cleaning liquid for cleaning the first treatment liquid brought into contact with the surface, to be processed, of the substrate.

According to one aspect of the present invention, the container is opened and closed by swinging the covering member; on the other hand, the container is stopped at three positions including a first position at which the container approaches the substrate or the substrate enters the container, a second position at which the container is positioned away from the substrate and is covered with the covering member, and a third position at which the container is further lowered.

DETAILED DESCRIPTION OF THE PREFERRED EMBODIMENTS

Embodiments of the present invention will be described below in detail with reference to the drawings.

First Embodiment

Figure 1:
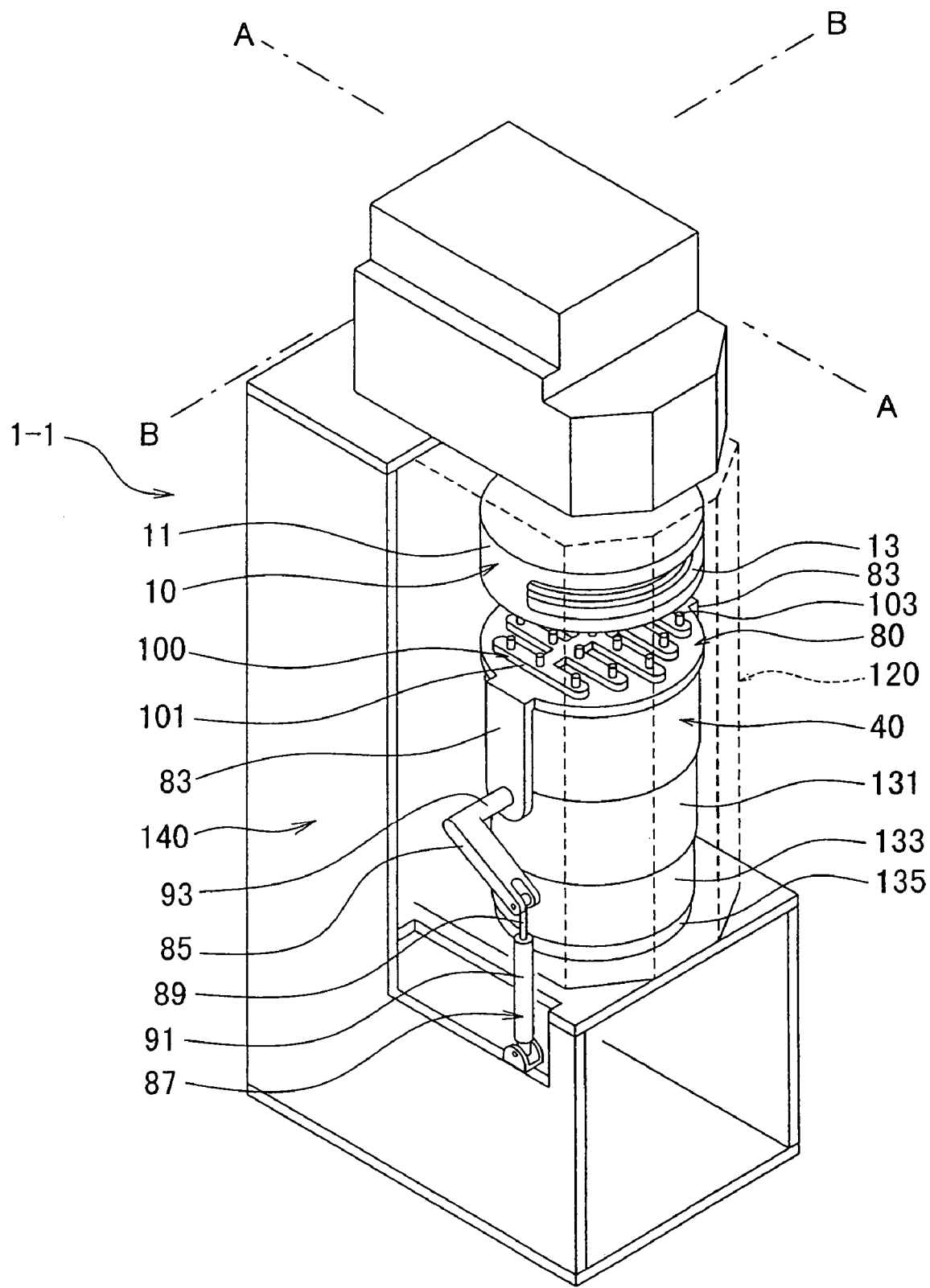
FIG. 1 is a schematic perspective view showing a substrate processing apparatus 1-1 according to an embodiment in which the present invention is applied to a pretreatment process of an electroless plating.
Figure 2:
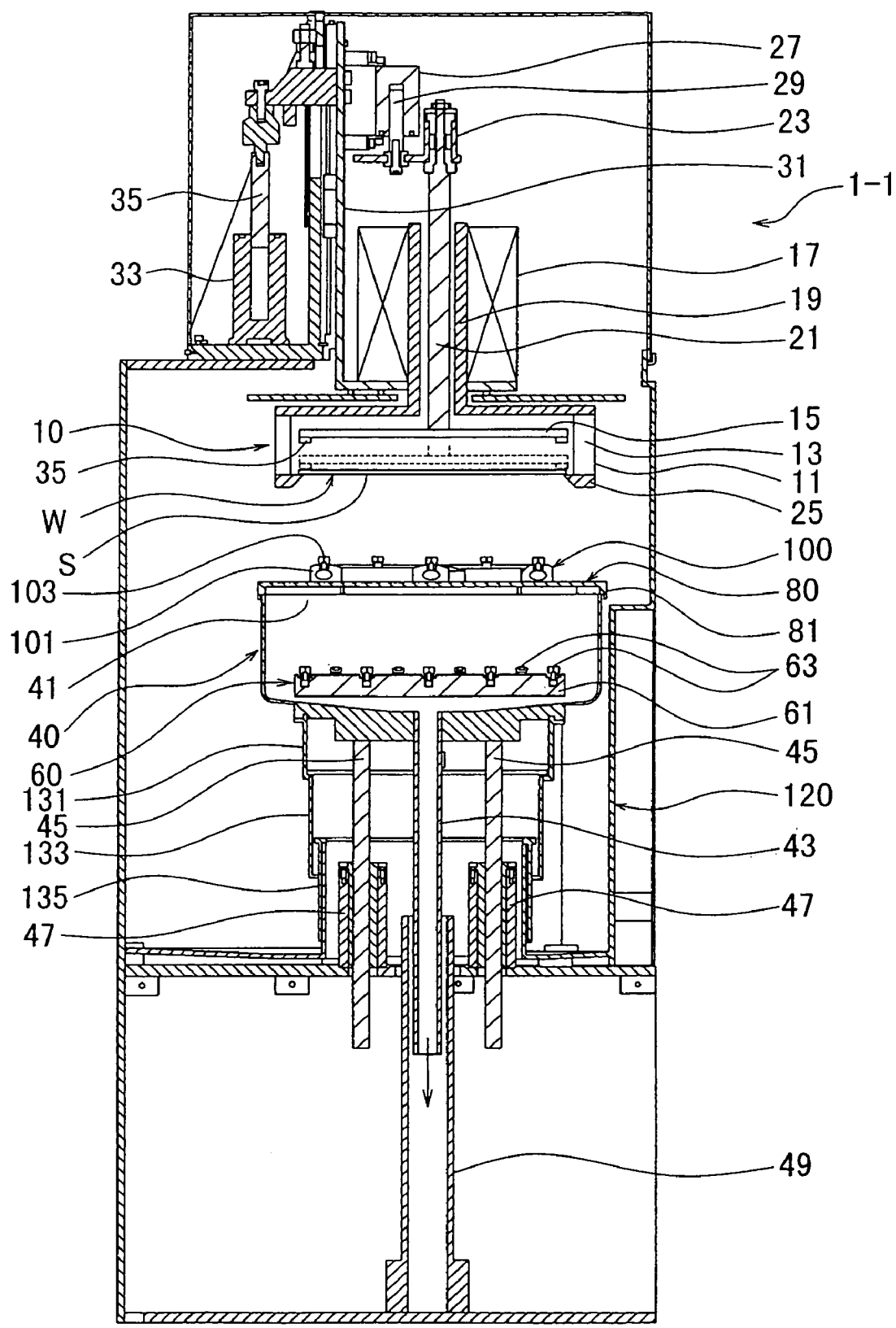
FIG. 2 is a schematic cross-sectional view taken along a line A—A of FIG. 1.
Figure 3:
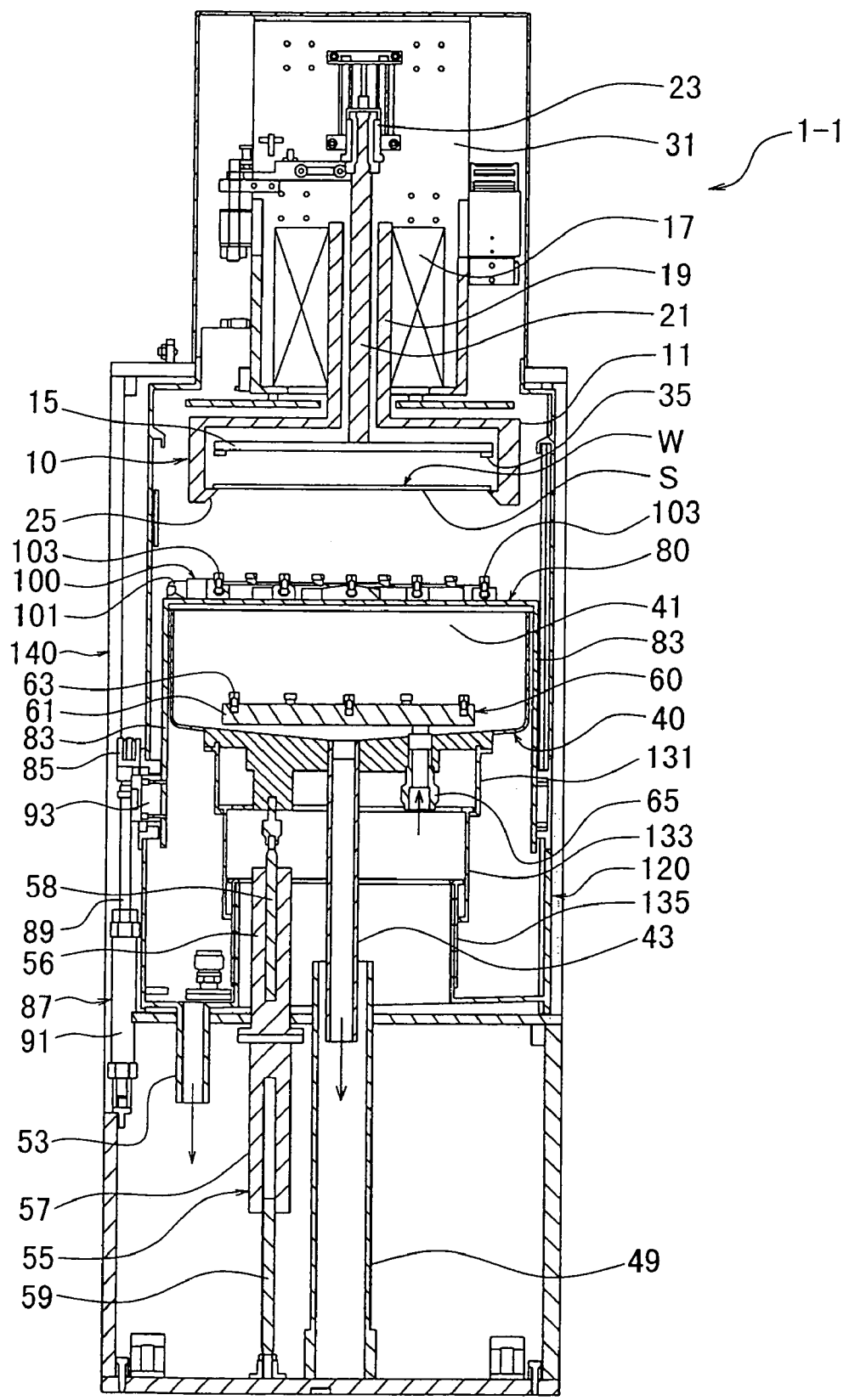
FIG. 3 is a schematic cross-sectional view taken along a line B—B of FIG. 1.

FIG. 1 is a schematic perspective view showing a substrate processing apparatus 1-1 according to an embodiment in which the present invention is applied to a pretreatment process of an electroless plating, FIG. 2 is a schematic cross-sectional view taken along a line A—A of FIG. 1, and FIG. 3 is a schematic cross-sectional view taken along a line B—B of FIG. 1. As shown in FIGS. 1 through 3, the substrate processing apparatus 1-1 comprises a substrate holding device (substrate holding means) 10 for holding a substrate W, a container 40, a first treatment liquid supply device (first treatment liquid supply means) 60 provided in the container 40, a covering member 80 covering an opening portion 41 of the container 40, a second treatment liquid supply device (second treatment liquid supply means) 100 mounted on an upper surface of the covering member 80, and a second container 120 surrounding the container 40 and holding a second treatment liquid ejected from the second treatment liquid supply device 100. These components are arranged on a plate-like mounting base 140. These components will be described below.

The substrate holding device 10 has a housing 11, in the form of a downwardly opened cylinder with a bottom, having an opening 13 formed in a circumferential wall thereof, and a pressing member 15 disposed within the housing 11. The housing 11 is coupled to an output shaft 19 of a motor 17. An axis 21 is attached to a center of the pressing member 15, extends through a hollow portion inside of the output shaft 19, and projects from an upper portion of the output shaft 19. An end of the axis 21 is pivotally supported by a pivoting device (pivoting means) 23. A ring-like substrate holding portion 25, with prejects projecting inwardly, is provided at a lower end of the housing 11, and the substrate W is placed on an upper surface of the substrate holding portion 25. A sealing member is mounted on an abutment portion of the substrate holding portion 25 on which the substrate W is placed, thereby sealing the abutment portion. An outside diameter of the housing 11 is slightly smaller than an inside diameter of the opening portion 41 of the container 40, which will be described below, and the housing 11 is arranged in its dimension and shape so as to almost cover the opening portion 41.

The pivoting device 23 is fixed to a rod 29 of a cylinder mechanism 27 which serves to vertically move the pivoting device 23. The cylinder mechanism 27 itself is fixed to a mounting base 31 on which the motor 17 and the like are placed. The mounting base 31 is attached to a rod 35 of a cylinder mechanism 33 fixed on the mounting base 140. Specifically, the substrate holding device 10 including the motor 17, the cylinder mechanism 27, and the like can move vertically as a whole by the cylinder mechanism 33 while the pressing member 15 solely moves vertically by the cylinder mechanism 27, and the housing 11 is rotatably driven by the motor 17. When the pressing member 15 is lowered to allow a ring-like pressing portion 35 provided at a peripheral portion of the pressing member 15 to press the substrate W placed on the substrate holding portion 25, the pressing member 15 also rotates according to the rotation of the housing 11.

The container 40 is a cup-like receptacle having an opening portion 41 at an upper surface thereof.

The first treatment liquid supply device 60 is provided near a bottom of the container 40, and a drain pipe 43 extending downwardly from a center of the bottom of the container 40 is attached to the container 40. Two rods 45, 45 are fixed at both sides of the drain pipe 43 so as to extend downwardly. Lower ends of the rods 45, 45 are inserted into cylindrical ball bushes 47, 47 so as to be vertically movable to thus form a guiding mechanism (including the rods 45, 45 and the ball bushes 47, 47) for vertically moving the container 40.

A lower portion of the drain pipe 43 is inserted into a second drain pipe 49, so that a liquid (first treatment liquid) in the container 40 can be drained through the second drain pipe 49. The container 40 and the housing 11 are housed in the second container 120 surrounding these components, and a drain pipe 53 is connected to a bottom of the second container 120. The drain pipe 53 is connected to a drain hose, which is not shown, to drain a liquid (second treatment liquid) in the second container 120.

A driving device (driving means) 55 is mounted on a lower surface of the container 40. The driving device 55 is arranged as follows. Specifically, ends of rods 58 and 59 of two cylinder mechanisms 56 and 57 are mounted on the container 40 and the bottom of the mounting base 140, respectively. As shown in FIG. 3, when only one of the rods 59 is extended, the container 40 is moved to an intermediate position (a second position in which the covering member 80 covers the container 40). When both of the rods 58 and 59 are extended, the container 40 is moved to an uppermost position (a first position in which the container 40 approaches the substrate W). When both of the rods 58 and 59 are withdrawn, the container 40 is moved to a lowermost position (a third position which is lower than the second position and in which the covering member 80 can be rotated). Three cylindrical covers 131, 133 and 135 which have diameters that are slightly different from each other are attached to the lower surface of the container 40 so as to be extendable, so that the second treatment liquid is prevented from being introducing into the guiding mechanism including the rods 45, 45, the driving device 55, and the like.

The first treatment liquid supply device 60 has a number of nozzles (first treatment liquid ejecting devices) 63 provided on a base 61, and a first treatment liquid supplied from a first treatment liquid supply pipe 65 connected to the base 61 is supplied to the respective nozzles 63 and ejected upwardly therefrom.

The covering member 80 is substantially in the form of a circular plate, and a ring-like sealing portion 81 for covering and sealing the opening portion 41 of the container 40 is provided at a peripheral portion of a lower surface of the covering member 80. Arm portions (swinging devices) 83, 83 are provided at a periphery of the covering member 80 on right and left sides, and tips of the arm portions are folded and bent downwardly so as to be substantially perpendicular to the surface of the covering member 80. A tip of one of the arm portions 83 is connected to an end of an L-shaped lever (swinging device) 85, and a rod (swinging device) 89 of a cylinder mechanism (swinging device) 87 is rotatably connected to the other end of the lever 85. A lower end portion of a body 91 of the cylinder mechanism 87 is rotatably mounted on the mounting base 140. A shaft portion 93 of a lateral end of the lever 85 which is fixed to the arm 83 is rotatably mounted to a side surface of the second container 120. A tip of the arm 83 in which the lever 85 is not provided is also rotatably mounted to an opposite side surface of the second container 120. Therefore, when the cylinder mechanism 87 is actuated from a state shown in FIG. 1 to extend the rod 89, the lever 85 is rotated about the shaft portion 93 to rotate the covering member 80 as a whole about the shaft portion 93. Since FIG. 1 shows that the container 40 is held in abutment with the lower surface of the covering member 80, the covering member 80 cannot be rotated.

The second treatment liquid supply device 100 has a number of nozzles (second treatment liquid ejecting devices) 103 provided on a base 101 mounted on an upper surface of the covering member 80, and a second treatment liquid supplied from a second treatment liquid supply pipe, which is not shown, connected to the base 101 is supplied to the respective nozzles 103 and ejected upwardly therefrom.

In this embodiment, any one of chemical liquids including an acidic solution such as $H_2SO_4$, a mixture solution such as a mixture of $PdCl_2$ and HCL, sodium citrate, and the like is used as the first treatment liquid. A cleaning liquid such as ultra pure water is used as the second treatment liquid.

Next, operation of the substrate processing apparatus 1-1 will be described below with reference to FIGS. 1 through 6.

Because FIGS. 1 through 3 show that the second treatment liquid is ejected by the second treatment liquid supply device 100, the following description will start from completion of the cleaning process. After the cleaning of a surface S, to be processed, of the substrate W is completed, the pressing member 15 is moved and lifted from a position shown by dotted lines in FIG. 2 to a position shown by solid lines. A robot hand having a suction mechanism provided on a lower surface thereof is inserted from the opening 13 to attract the upper surface of the substrate W by suction, and the substrate W is withdrawn from the opening 13. Next, the robot hand which has attracted, on the lower surface thereof, another substrate W that has not been processed is inserted from the opening 13, and the suction is released to place the lower peripheral surface of the substrate W onto the substrate holding portion 25. After the robot hand is withdrawn from the opening 13, the pressing member 15 is lowered to press the upper peripheral surface of the substrate W against the substrate holding portion 25 for sealing.

Figure 4:
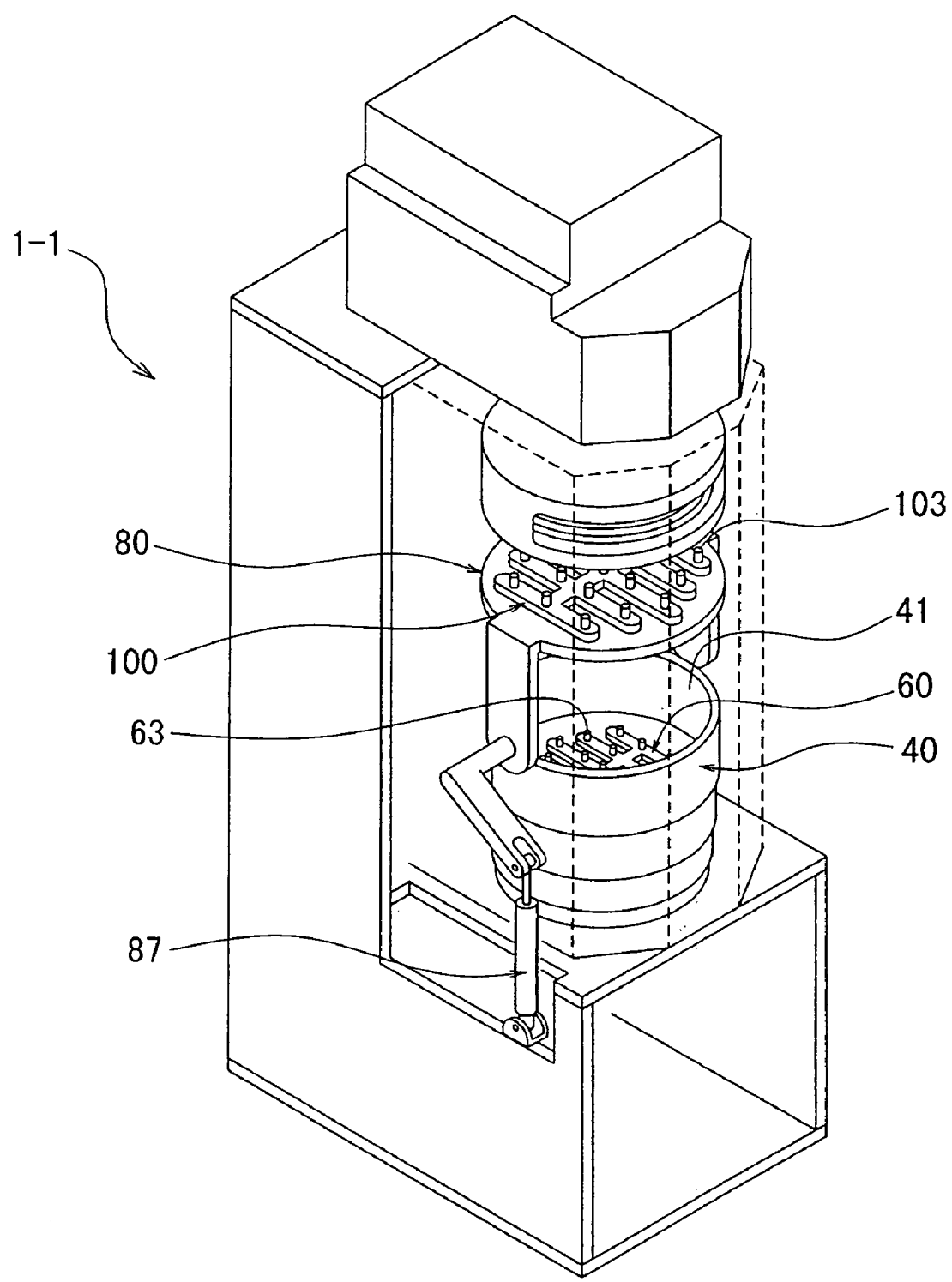
FIG. 4 is a schematic view explanatory of the operation of the substrate processing apparatus 1-1.
Figure 5:
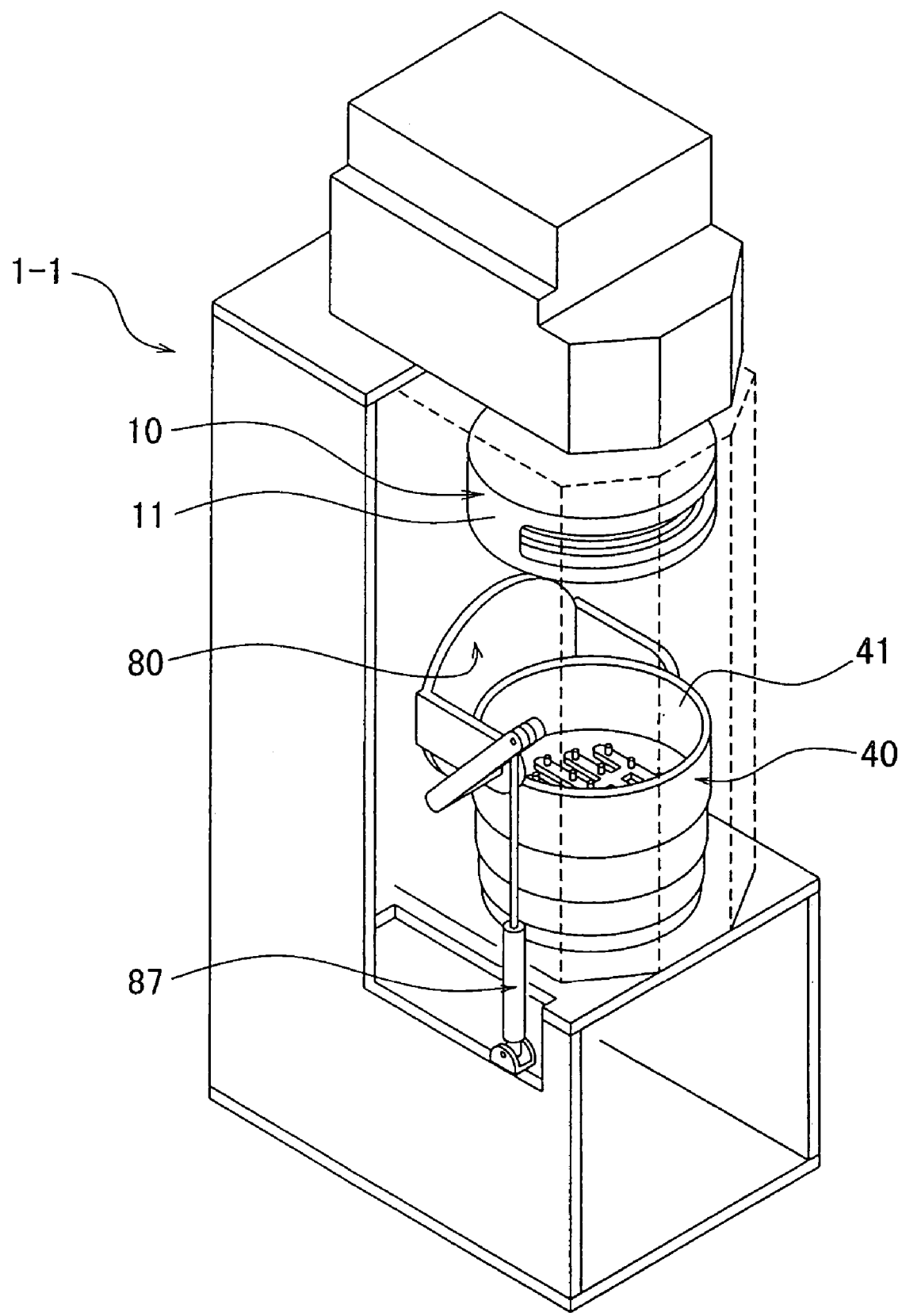
FIG. 5 is a schematic view explanatory of the operation of the substrate processing apparatus 1-1.
Figure 6:
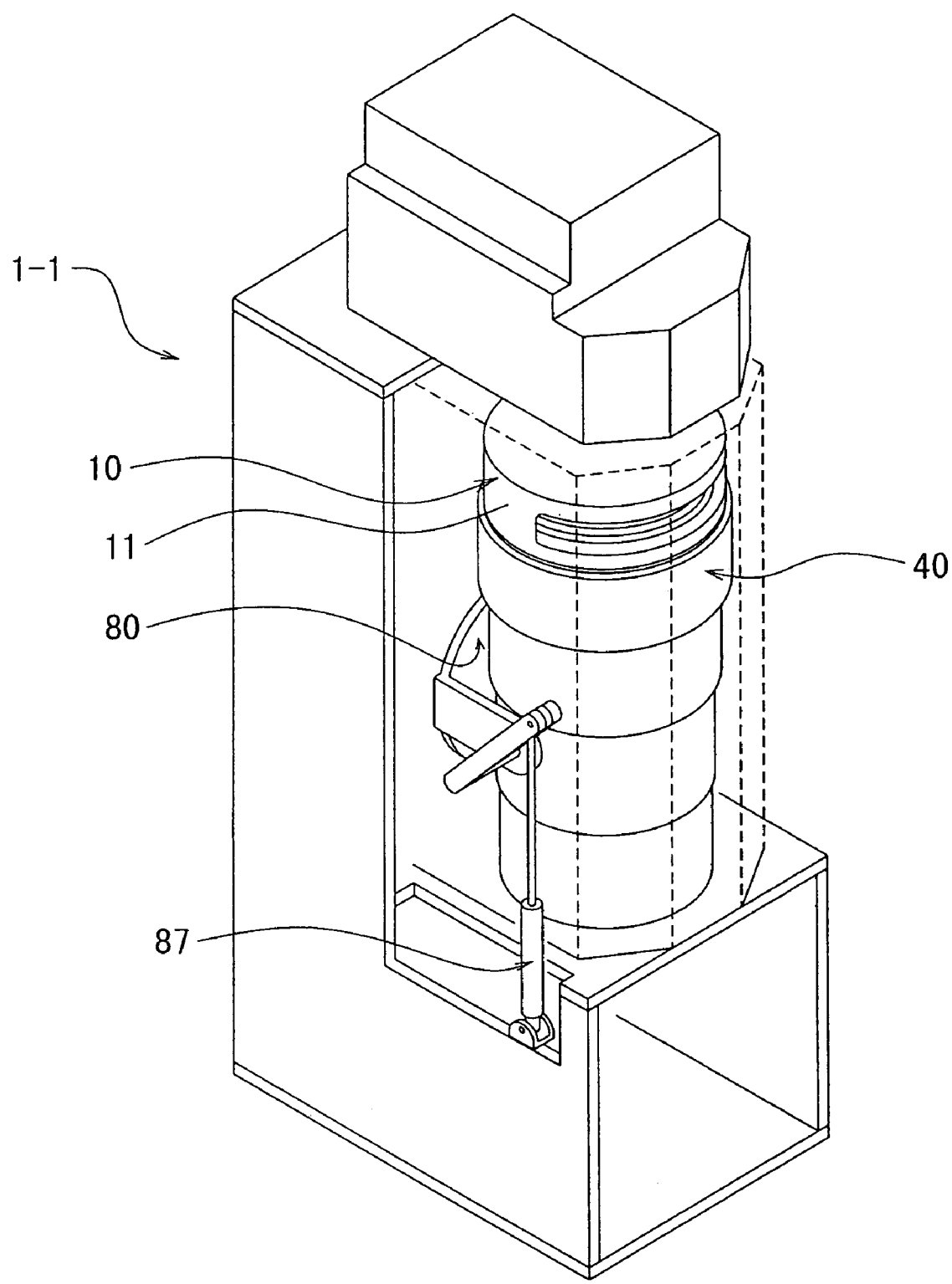
FIG. 6 is a schematic view explanatory of the operation of the substrate processing apparatus 1-1.

On the other hand, in the course of, before, or after exchanging substrates W as described above, the container 40 is moved to the lowermost position (third position) as shown in FIG. 4. In this state, the cylinder mechanism 87 is actuated to swing and lay down the covering member 80 as shown in FIG. 5. Then, the container 40 is lifted to the uppermost position (first position) as shown in FIG. 6 so that the opening portion 41 of the container 40 covers a lower peripheral portion of the housing 11.

In this state, the first treatment liquid supplied from the first treatment liquid supply pipe 65 is ejected upwardly from the respective nozzles 63 to supply the first treatment liquid onto the surface S, to be processed, of the substrate W for pretreatment of the surface S to be plated. At that time, since the periphery of the housing 11 is covered with the container 40, a gap between these structures becomes small. Further, since the substrate W is sealed by the substrate holding portion 25, the first treatment liquid hardly leaks out of the container 40, and hence almost all the first treatment liquid is stored in the container 40 and discharged and recovered from the drain pipe 43. Because the chemical liquid as the recovered first treatment liquid is not mixed with the cleaning liquid as the second treatment liquid, the chemical liquid is not diluted with the cleaning liquid and can readily be reused to reduce the amount of the chemical liquid consumed.

After the process with the first treatment liquid is completed, the supply of the first treatment liquid is stopped, and the housing 11 is rotated to remove the first treatment liquid. Then, the container 40 is lowered to the lowermost position (third position) as shown in FIG. 5, and the covering member 80 is swung to a position above the container 40 as shown in FIG. 4. Next, the container 40 is lifted to the intermediate position (second position) to contact the upper end of the container 40 with the lower peripheral portion of the covering member 80, thereby hermetically sealing the interior of the container 40, as shown in FIGS. 1 through 3.

In this state, the second treatment liquid is ejected upwardly from the respective nozzles 103 of the second treatment liquid supply device 100 to supply the second treatment liquid onto the surface S, to be processed, of the substrate W for rinsing the chemical liquid (first treatment liquid) on the surface S, to be processed, of the substrate W. At that time, since the container 40 is hermetically sealed, the second treatment liquid is not introduced into the interior of the container 40, and the first treatment liquid to be recovered from the container 40 is not diluted. The second treatment liquid is collected on the bottom of the second container 120 and discharged and recovered from the drain pipe 53. The recovered second treatment liquid may be reused or discarded.

Plating Apparatus According to First Embodiment

Figure 7:
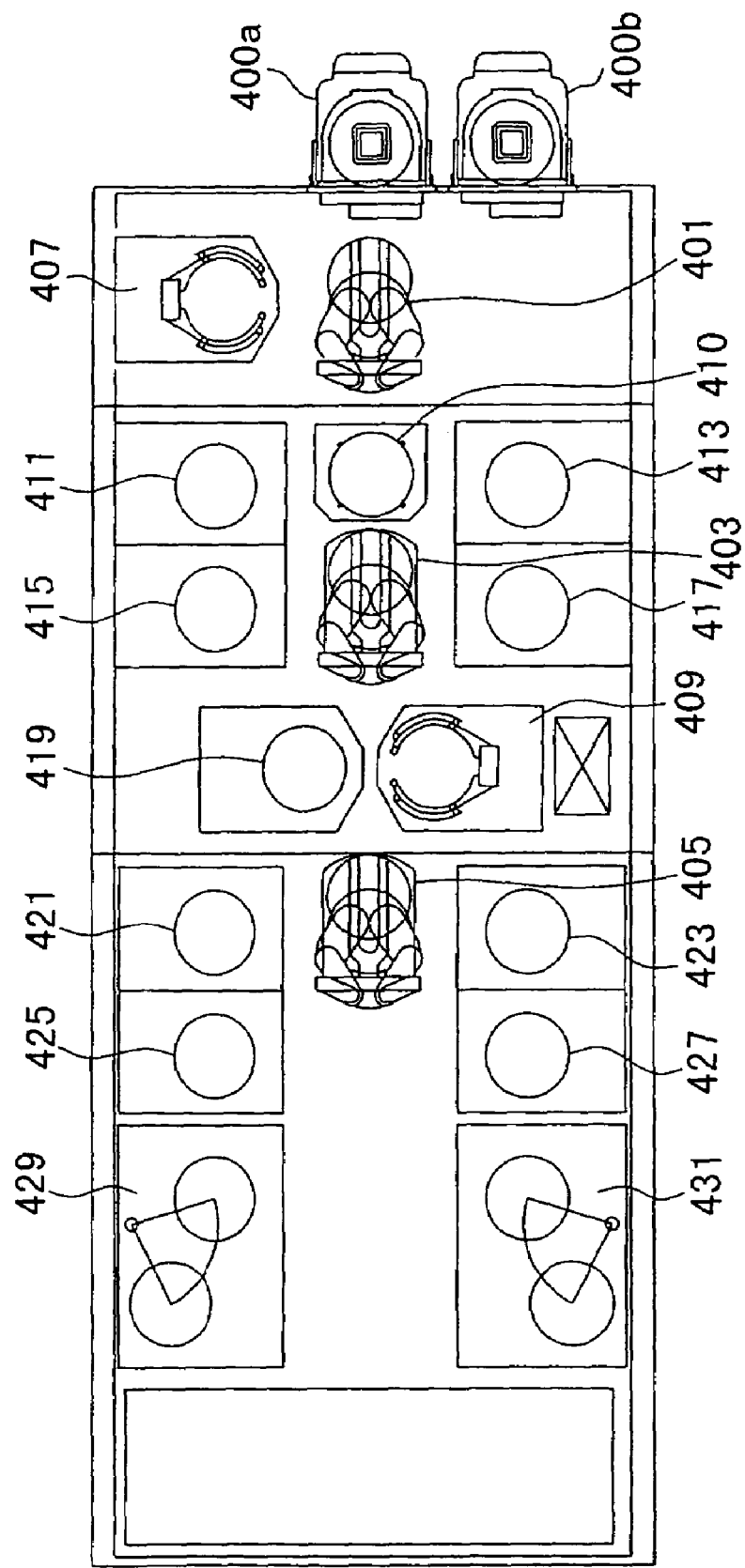
FIG. 7 is a plan view of a substrate processing mechanism having the substrate processing apparatus 1-1.

FIG. 7 is a plan view of a substrate processing mechanism (plating apparatus) having a substrate processing apparatus 1-1 according to the first embodiment. As shown in FIG. 7, the substrate processing mechanism comprises a load unit 400a and an unload unit 400b for housing a substrate cassette accommodating substrates W, three transferring portions (transferring robots) 401, 403 and 405 for transferring a substrate W, two reversing machines 407 and 409, a temporary placement stage 410, two drying portions 411 and 413, two cleaning portions 415 and 417, a substrate pretreatment device 419 using a chemical liquid (e.g., dilute sulfuric acid), two substrate pretreatment devices 421 and 423 using a chemical liquid (e.g., palladium acetate), two substrate pretreatment devices 425 and 427 using a chemical liquid (e.g., citrate), and two electroless plating devices 429 and 431. The substrate processing apparatus 1-1 according to the first embodiment is used as the respective substrate pretreatment devices 419, 421, 423, 425, and 427. The substrate pretreatment device 419, the substrate pretreatment devices 421 and 423, and the substrate pretreatment devices 425 and 427 differ from each other only in that different chemical liquids are used as the first treatment liquids. In any substrate pretreatment device, a cleaning liquid of ultra pure water is used as the second treatment liquid.

First, the transferring portion 401 takes out a substrate W in the load unit 400a and delivers it to the reversing machine 407, where the substrate W is reversed, and the reversed substrate W is placed on the temporary placement stage 410 by the transferring portion 401. The substrate W placed on the temporary placement stage 410 is transferred to the substrate pretreatment device 419 by the transferring portion 403. In the substrate pretreatment device 419, the surface S, to be processed, of the substrate W is processed with a chemical liquid (e.g., dilute sulfuric acid) and then cleaned with a cleaning liquid.

The substrate W which has been cleaned is transferred to the subsequent substrate pretreatment device 421 (or 423) by the transferring portion 405, and the surface S, to be processed, of the substrate W is processed with a chemical liquid (e.g., palladium acetate) and then cleaned with a cleaning liquid. Similarly, the substrate W, which has been cleaned, is transferred the subsequent substrate pretreatment device 425 (or 427) by the transferring portion 405, and the surface S, to be processed, of the substrate W is processed with a chemical liquid (e.g., citrate) and then cleaned with a cleaning liquid.

The substrate W which has been cleaned is delivered to the electroless plating device 429 (or 431) by the transferring portion 405, and is subject to an electroless plating process (cover plating process) and a cleaning process. Then, the substrate W is delivered to the reversing machine 409, where the substrate W is reversed, by the transferring portion 405, and delivered to the cleaning portion 417 (or 415), which performs cleaning with a roll brush, by the transferring portion 403. Further, the substrate W is delivered to the drying portion 413 (or 411), where the substrate W is cleaned and then spin-dried, by the transferring portion 403 and delivered to the unload unit 400b by the transferring portion 401.

Second Embodiment

Figure 8:
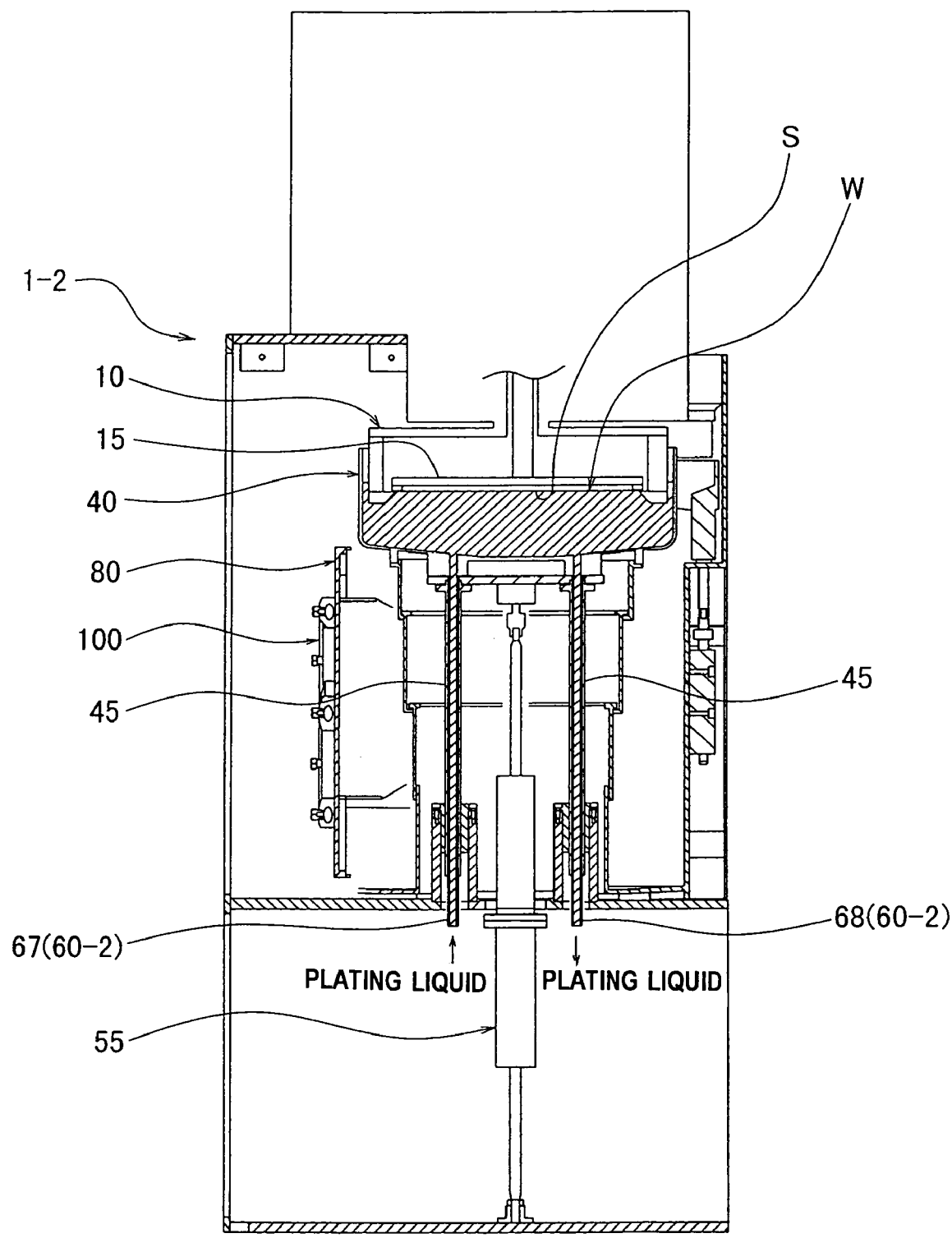
FIG. 8 is a schematic cross-sectional view showing a substrate processing apparatus 1-2 according to an embodiment in which the present invention is applied to an electroless plating apparatus (a cross-sectional view of portions corresponding to FIG. 2)

FIG. 8 is a schematic cross-sectional view showing a substrate processing apparatus 1-2 according to an embodiment in which the present invention is applied to an electroless plating apparatus (a cross-sectional view of portions corresponding to FIG. 2). In FIG. 8, the same or corresponding components are designated by the same reference numerals as in the first embodiment. In this embodiment, instead of the base 61 provided in the container 40 and the first treatment liquid supply device 60 having nozzles 63 of the first embodiment, a first treatment liquid supply device (first treatment liquid supply means) 60-2 is constituted by a plating liquid supply pipe 67 extending through one of the rods 45 and connecting to the bottom of the container 40, and a plating liquid discharge pipe 68 extending through the other of the rods 45 and connecting to the bottom of the container 40. Specifically, the first treatment liquid supply device 60-2 is arranged as a first treatment liquid holding means for storing the first treatment liquid in the container 40 and immersing the surface S, to be processed, of the substrate W in the first treatment liquid.

An electroless plating liquid (first treatment liquid) is supplied in advance to the container 40 from the plating liquid supply pipe 67 to store a predetermined amount of the electroless plating liquid in the container 40, and simultaneously the electroless plating liquid is discharged from the plating liquid discharge pipe 68 to circulate the electroless plating liquid stored in the container 40. The container 40 is lifted to the uppermost position (first position) in a state in which the covering member 80 is laid down as shown in FIG. 8, and the surface S, to be processed, of the substrate W is immersed in the surface of the electroless plating liquid, thereby performing electroless plating on the surface S to be processed.

Next, after the container 40 is lowered to the lowermost position (third position), the covering member 80 is swung so as to rise up, and then the container 40 is lifted to the intermediate position (second position) to hermetically seal the container 40 by the covering member 80. In this state, a cleaning liquid (second treatment liquid) is ejected from the second treatment liquid supply device 100 provided on the covering member 80 to clean the surface S, to be processed, of the substrate W which has been plated. At the time of cleaning, since the container 40 is hermetically sealed, the cleaning liquid is not mixed with the electroless plating liquid in the container 40.

After cleaning is completed, the container 40 is lowered to the lowermost position (third position), and the covering member 80 is laid down. On the other hand, the substrate W that has been processed and held by the substrate holding device 10 is exchanged with a substrate W that has not been processed, and the container 40 is lifted again to the uppermost position (first position) to perform electroless plating.

Third Embodiment

Figure 9:
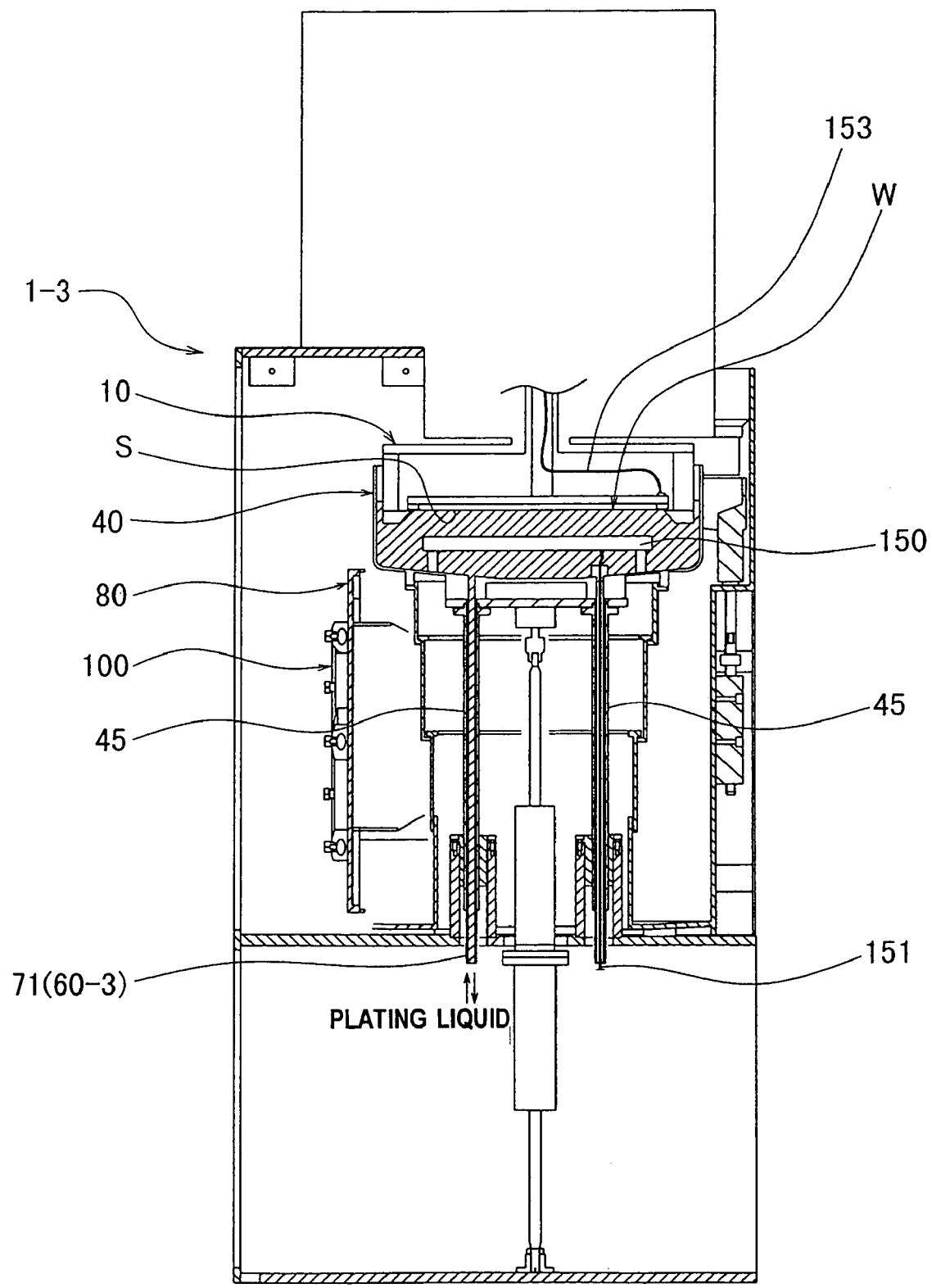
FIG. 9 is a schematic cross-sectional view showing a substrate processing apparatus 1-3 according to an embodiment in which the present invention is applied to an electrolytic plating apparatus (a cross-sectional view of portions corresponding to FIG. 2)
Figure 10:
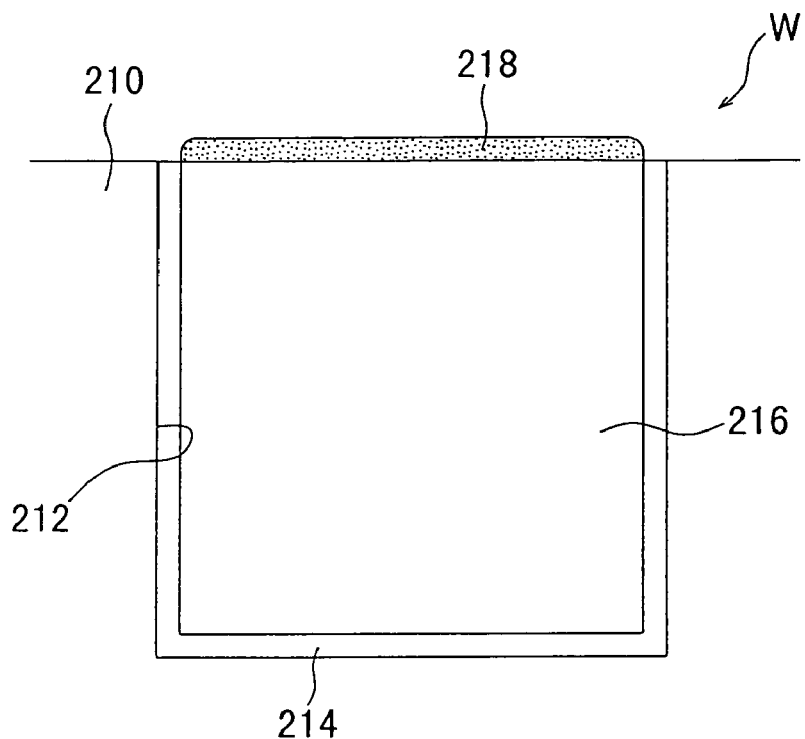
FIG. 10 is a cross-sectional view showing a semiconductor substrate.
Figure 11:
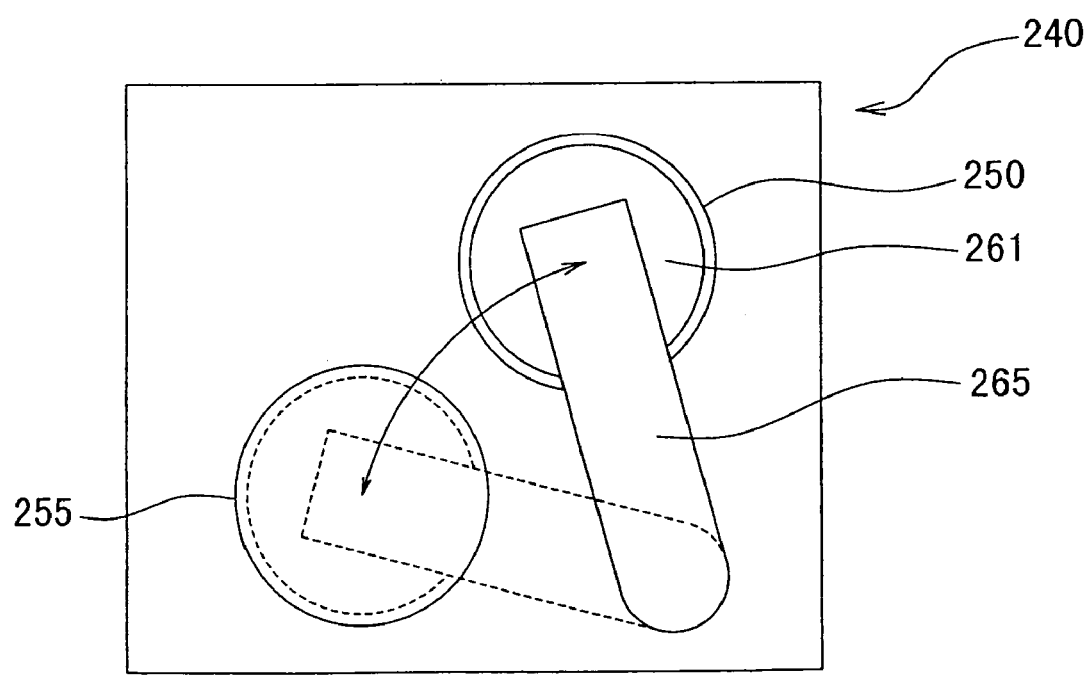
FIG. 11 is a schematic view of a conventional pretreatment unit 240.

FIG. 9 is a schematic cross-sectional view showing a substrate processing apparatus 1-3 according to an embodiment in which the present invention is applied to an electrolytic plating apparatus (a cross-sectional view of portions corresponding to FIG. 2). In FIG. 9, the same or corresponding components are designated by the same reference numerals as in the first embodiment. In this embodiment, instead of the base 61 provided in the container 40 and the first treatment liquid supply device 60 having nozzles 63 of the first embodiment, a first treatment liquid supply device (first treatment liquid supply means) 60-3 is constituted by a plating liquid supply/discharge pipe 71 extending through one of the rods 45 and connecting to the bottom of the container 40 for supplying the plating liquid to and discharging the plating liquid from the container 40. The first treatment liquid supply device 60-3 is arranged as a first treatment liquid holding means for storing the first treatment liquid in the container 40 and immersing the surface S, to be processed, of the substrate W in the first treatment liquid. Further, a plate-like anode 150 is provided in the container 40, and wiring 151 extending through the other of the rods 45 is connected to the anode 150 to apply a positive voltage to the anode. On the other hand, wiring 153 for applying a negative voltage to the substrate W is connected to the substrate holding device 10.

An electrolytic plating liquid (first treatment liquid) is supplied in advance to the container 40 from the plating liquid supply/discharge pipe 71 to store a predetermined amount of the electrolytic plating liquid in the container 40 so as to immerse the anode 150 in the plating liquid, and simultaneously the container 40 is lifted to the uppermost position (first position) in a state in which the covering member 80 is laid down as shown in FIG. 9. Thus, the surface S, to be processed, of the substrate W is immersed in the surface of the electrolytic plating liquid, and a predetermined voltage is applied between the anode 150 and the surface S, to be processed, of the substrate W as a cathode, thereby performing electrolytic plating on the surface S to be processed.

Next, after the container 40 is lowered to the lowermost position (third position), the covering member 80 is swung up, and then the container 40 is lifted to the intermediate position (second position) to hermetically seal the container 40 by the covering member 80. In this state, a cleaning liquid (second treatment liquid) is ejected from the second treatment liquid supply device 100 provided on the covering member 80 to clean the surface S, to be processed, of the substrate W. At the time of cleaning, since the container 40 is hermetically sealed, the cleaning liquid is not mixed with the electrolytic plating liquid in the container 40.

After cleaning is completed, the container 40 is lowered to the lowermost position (third position), and the covering member 80 is laid down. On the other hand, the substrate W that has been processed and held by the substrate holding device 10 is exchanged with a substrate W that has not been processed, and the container 40 is lifted again to the uppermost position to perform electrolytic plating.

When the wiring 151 is set to be a negative voltage and the wiring 153 is set to be a positive voltage, electrolytic etching of the surface S to be processed can be performed instead of electrolytic plating. Further, the electroless plating apparatus shown in FIG. 8 and the electrolytic plating apparatus shown in FIG. 9 can be used instead of the electroless plating devices 429, 431 shown in FIG. 7, and in such a case, the whole plating apparatus can be reduced in size.

Other Substrate Processing Mechanisms According to the Above Embodiments

Figure 12:
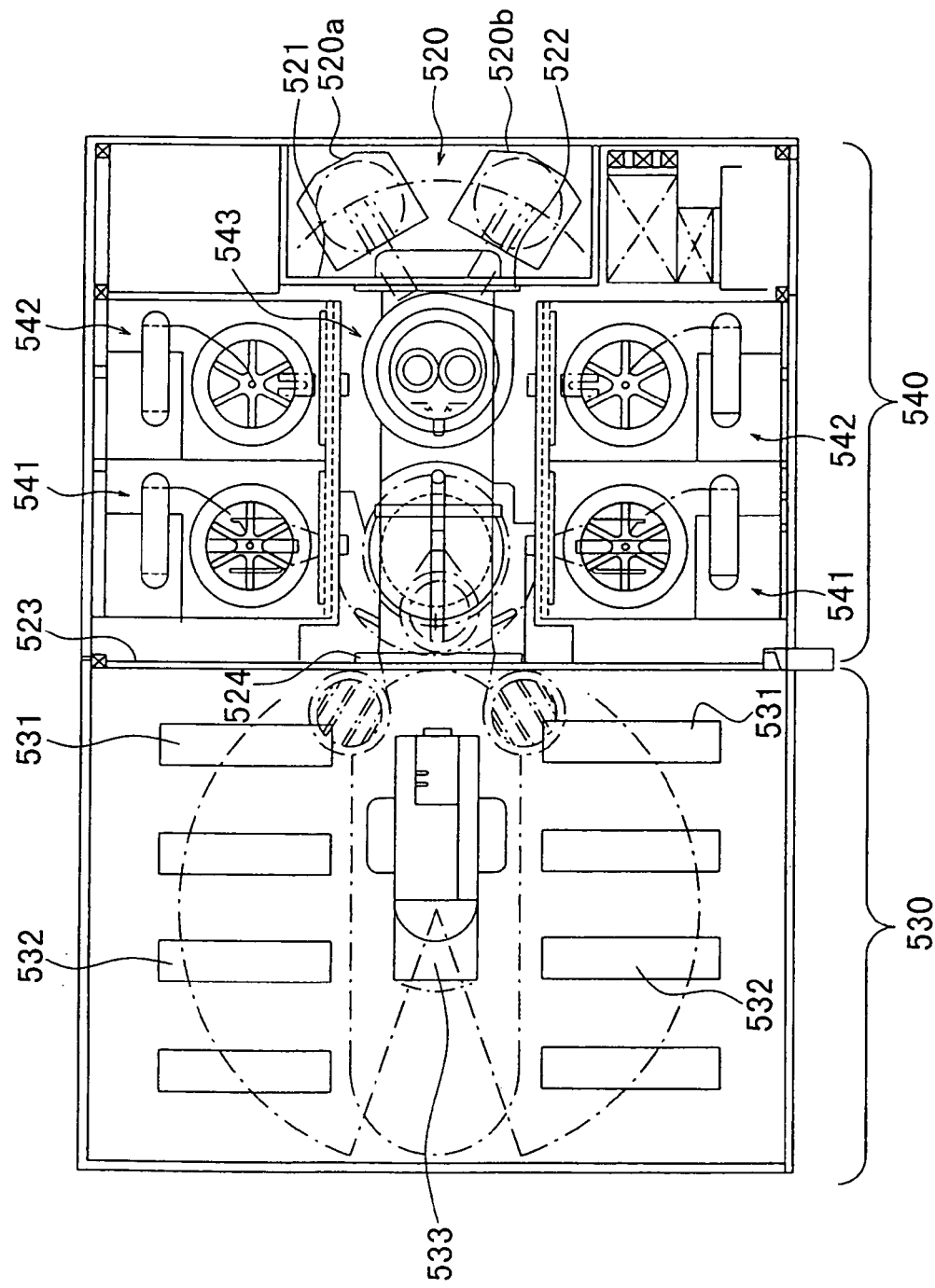
FIG. 12 is a plan view showing a substrate processing mechanism.

FIG. 12 is a plan view of a substrate processing mechanism (plating apparatus) having a substrate processing apparatus 1-1 according to the first embodiment. As shown in FIG. 12, the substrate processing apparatus comprises a loading/unloading area 520 for transferring a substrate cassette accommodating semiconductor substrates, a processing area 530 for processing semiconductor substrates, and a cleaning/drying area 540 for cleaning and drying processed semiconductor substrates. The cleaning/drying area 540 is positioned between the loading/unloading area 520 and the processing area 530. A partition wall 521 is provided between the loading/unloading area 520 and the cleaning/drying area 540, and a partition wall 523 is provided between the cleaning/drying area 540 and the processing area 530.

The partition wall 521 has a passage (not shown) defined therein for transferring semiconductor substrates therethrough between the loading/unloading area 520 and the cleaning/drying area 540, and a shutter 522 for opening and closing the passage. The partition wall 523 has a passage (not shown) defined therein for transferring semiconductor substrates therethrough between the cleaning/drying area 540 and the processing area 530, and a shutter 524 for opening and closing the passage. The cleaning/drying area 540 and the processing area 530 can independently be supplied with air and can independently discharge air.

The substrate processing mechanism thus constructed for semiconductor substrate interconnections is installed in a clean room, and the pressures in the respective areas are set as follows:

(The pressure in the loading/unloading area 520)>
(the pressure in the cleaning/drying area 540)>
(the pressure in the processing area 530)

The pressure in the loading/unloading area 520 is set to be lower than the pressure in the clean room. Therefore, air does not flow from the processing area 530 into the cleaning/drying area 540, air does not flow from the cleaning/drying area 540 into the loading/unloading area 520, and air does not flow from the loading/unloading area 520 into the clean room.

In the loading/unloading area 520, a loading unit 520a and an unloading unit 520b are disposed for housing a substrate cassette accommodating semiconductor substrates. The cleaning/drying area 540 has two rinsing portions 541 for processing plated substrates, two drying portions 542, and a transferring portion (transferring robot) 543 for transferring a semiconductor substrate. A pencil-shaped cleaner with a sponge mounted on a front end thereof or a roller with a sponge is used as the rinsing portions 541. A drier for spinning a semiconductor substrate at a high speed to dehydrate and dry the substrate is used as the drying portions 542.

The processing area 530 has pretreatment chambers 531 for performing pretreatment of a semiconductor substrate for plating (substrate processing apparatus 1-1 according to the present invention), and plating chambers 532 for performing copper plating (substrate processing apparatus 1-2 or 1-3 according to the present invention, wherein this is also applied to an apparatus for plating in the following substrate processing mechanisms), and a transferring portion (transferring robot) 533 for transferring a semiconductor substrate.

Figure 13:
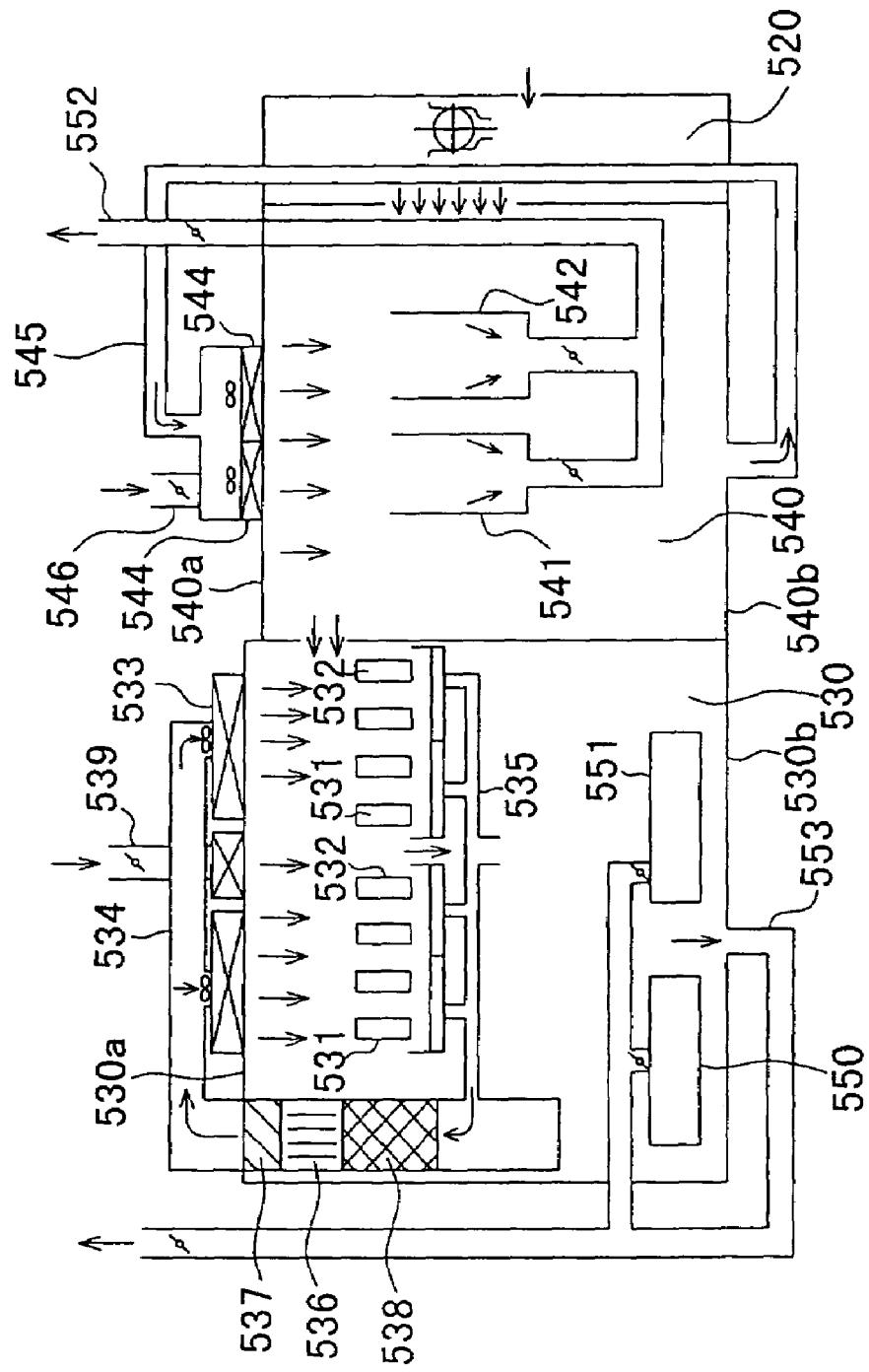
FIG. 13 is a diagram showing air flows in the substrate processing mechanism shown in FIG. 12.

FIG. 13 shows air flows in the substrate processing mechanism. In the cleaning/drying area 540, a fresh external air is introduced through a duct 546, and the introduced air is pushed through high-performance filters 544 by fans and supplied as downward flows of clean air into around the rinsing portions 541 and the drying portions 542. Most of the supplied clean air is returned from a floor 540b through a circulation duct 545 to the ceiling 540a, from which the clean air is pushed again through the high-performance filters 544 by the fans and circulated into the cleaning/drying area 540. Part of the clean air is discharged from the rinsing portions 541 and the drying portions 542 through a duct 552.

In the processing area 530, particles are not allowed to be applied to the surfaces of semiconductor substrates even though the processing area 530 is a wet zone. In order to prevent particles from being applied to semiconductor substrates, air is pushed through high-performance filters 533 by fans from a ceiling 530a into the processing area 530 so as to form downward flows of clean air.

However, if the entire amount of clean air as downward flows of clean air is supplied from the exterior, then a large amount of air is required to be introduced into and discharged from the processing area 530. Accordingly, air is discharged from the processing area 530 through a duct 553 at a rate sufficient to maintain the processing area 530 at a negative pressure, and most of the downward flows of clean air are circulated through ducts 534, 535.

The clean air that has passed through the processing area 530 contains a chemical mist and gases, if circulation air is employed. The chemical mist and gases are removed from the clean air by a scrubber 536 and mist separators 537, 538. The air returned into the circulation duct 534 over the ceiling 530a is free from any chemical mist and gases, and is pushed again through the high-performance filters 533 by the fans to circulate into the processing area 530.

Part of the air that has passed from a floor portion 530b through the processing area 530 is discharged from the processing area 530 through the duct 553, and thus air containing a chemical mist and gases is discharged from the processing area 530 through the duct 553. The amount of fresh air, which corresponds to the amount of the discharged air, is introduced through a duct 539 of the ceiling 530a into the processing area 530 so as to maintain the processing area 530 at a negative pressure.

As described above, the pressures in the loading/unloading area 520, the cleaning/drying area 540, and the processing area 530 are set as follows:

(The pressure in the loading/unloading area 520)>
(the pressure in the cleaning/drying area 540)>
(the pressure in the processing area 530)

Figure 14:
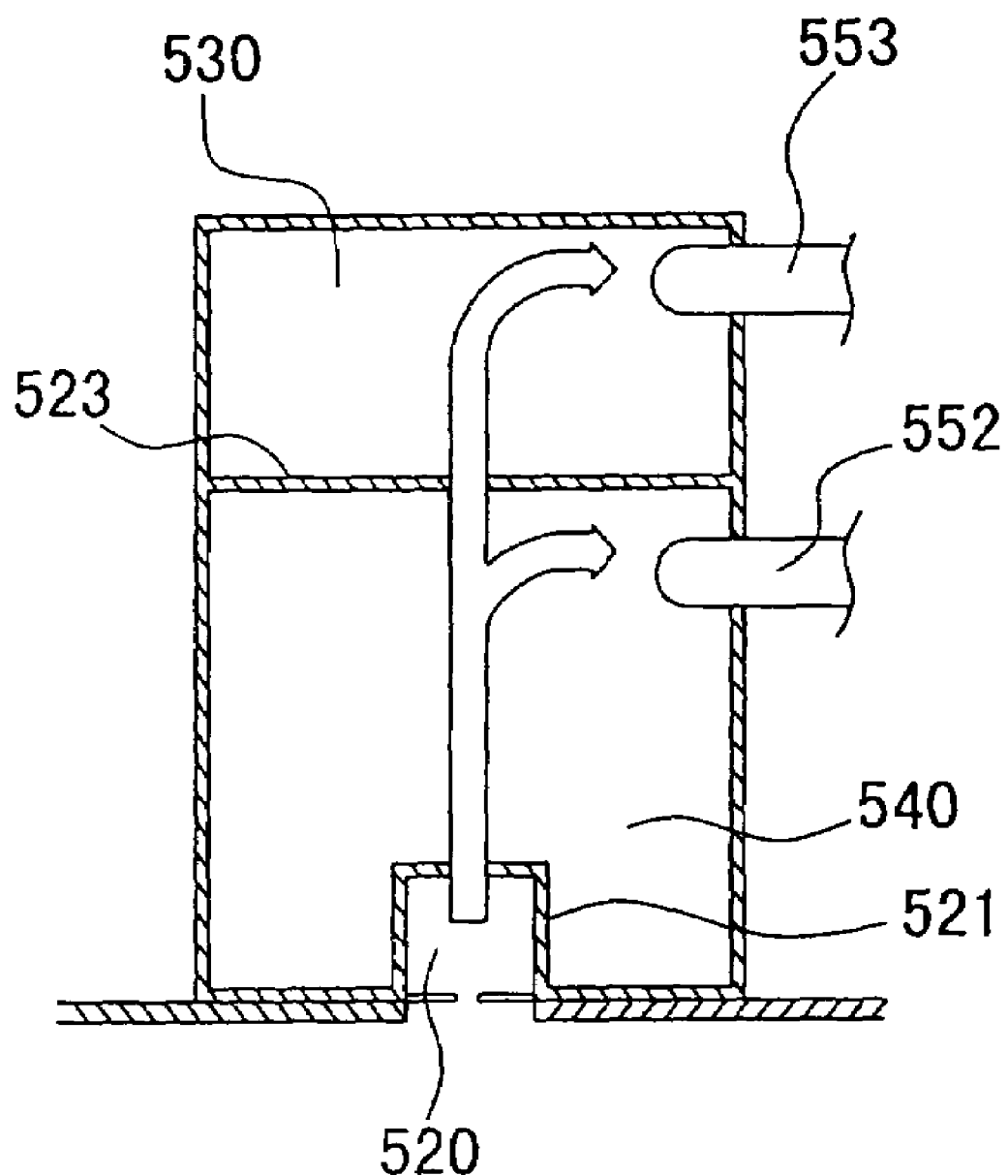
FIG. 14 is a diagram showing air flows between respective areas in the substrate processing mechanism shown in FIG. 12.

Therefore, when the shutters 522, 524 (see FIG. 12) are opened, air flows successively through the loading/unloading area 520, the cleaning/drying area 540, and the processing area 530, as shown in FIG. 14. Discharged air flows through the ducts 552 and 553 into an integrated discharge duct 554, as shown in FIG. 15.

Figure 15:
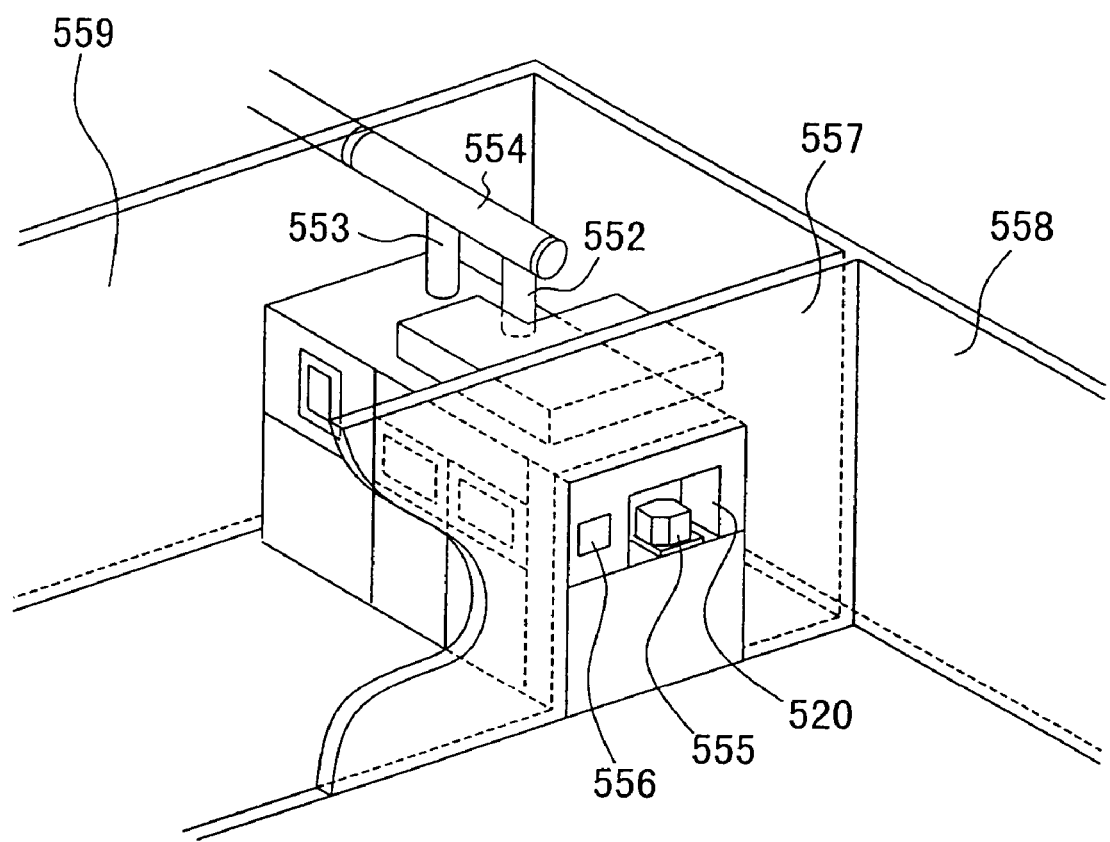
FIG. 15 is a perspective view showing an example in which the substrate processing mechanism showing in FIG. 12 is disposed in a clean room.

FIG. 15 is a perspective view showing an example in which a substrate processing mechanism is disposed in a clean room. A sidewall which has a cassette transfer port 555 defined in the loading/unloading area 520 and a control panel 556 is exposed to a working zone 558 that is compartmented in the clean room by a partition wall 557 so as to have a higher degree of cleanliness. Other sidewalls of the substrate processing mechanism are housed in a utility zone 559 which has a lower degree of cleanliness.

As described above, the cleaning/drying area 540 is disposed between the loading/unloading area 520 and the processing area 530. The partition walls 521, 523 are disposed between the loading/unloading area 520 and the cleaning/drying area 540 and between the cleaning/drying area 540 and the processing area 530, respectively. A semiconductor substrate which is loaded in a dried state from the working zone 558 through the cassette transfer port 555 into the substrate processing mechanism for semiconductor substrate interconnections is plated in the substrate processing mechanism and unloaded in a cleaned and dried state into the working zone 558. Consequently, no particles and mist are applied to the surface of the semiconductor substrate, and the working zone 558 in the clean room which has a higher level of cleanliness is prevented from being contaminated by particles, chemical liquid, and chemical mists.

In the example shown in FIGS. 12 and 13, the substrate processing mechanism has the loading/unloading area 520, the cleaning/drying area 540, and the processing area 530. However, an area accommodating a CMP device may be disposed in the processing area 530 or adjacent to the processing area 530, and the cleaning/drying area 540 may be disposed in the processing area 530 or between the area accommodating the CMP device and the loading/unloading area 520. Any of various other suitable areas and layouts may be employed insofar as a semiconductor substrate can be loaded in a dried state into the substrate processing mechanism for semiconductor substrate interconnections, and a plated semiconductor substrate can be cleaned and then unloaded in a dried state from the substrate processing mechanism.

In the above example, the substrate processing mechanism is a plating apparatus for semiconductor substrate interconnections. However, the substrate is not limited to a semiconductor substrate, and a portion to be plated is not limited to an interconnection portion formed on a surface of the substrate. Further, although copper plating has been described in the above example, the present invention is not limited to copper plating.

Figure 16:
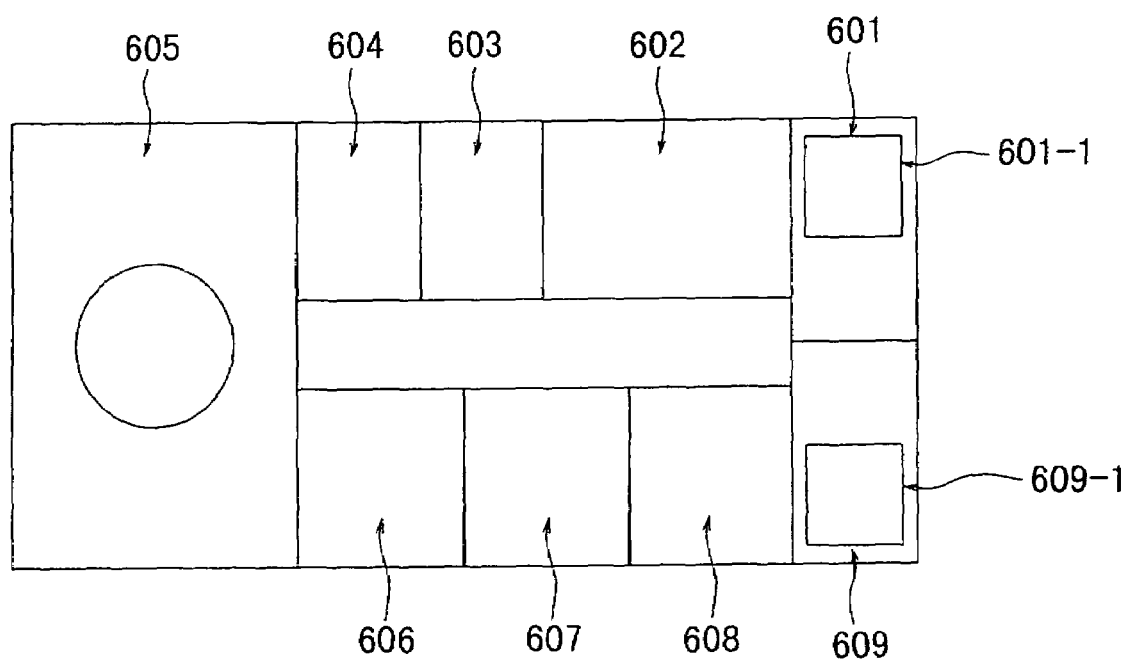
FIG. 16 is a plan view showing another example of a substrate processing mechanism.

FIG. 16 is a plan view of another substrate processing mechanism for semiconductor substrate interconnections. As shown in FIG. 16, the substrate processing mechanism for semiconductor substrate interconnections comprises a loading portion 601 for loading a semiconductor substrate, a copper plating chamber 602 for performing copper plating, rinsing chambers 603 and 604 for performing rinsing, a CMP portion 605 for performing chemical mechanical polishing (CMP), rinsing chambers 606 and 607 for performing rinsing, a drying chamber 608, and an unloading portion 609 for unloading a semiconductor substrate on which an interconnection layer has been formed. These chambers have a substrate transferring means (substrate transferring device), which is not shown, for transferring a semiconductor substrate to thus form a substrate processing mechanism for semiconductor substrate interconnections.

In the substrate processing mechanism thus constructed, the substrate transferring means takes out a semiconductor substrate W on which an interconnection layer has not been formed from a substrate cassette 601-1 placed on the loading portion 601 and transfers it to the copper plating chamber 602. In the copper plating chamber 602, a plated copper layer is formed on a surface of the semiconductor substrate W having an interconnection portion including an interconnection groove and an interconnection hole (contact hole).

The semiconductor substrate W on which the plated copper layer has been formed is transferred to the rinsing chamber 603 and the rinsing chamber 604 by the substrate transferring means and rinsed therein. Subsequently, the rinsed semiconductor substrate W is transferred to the CMP portion 605 by the substrate transferring means, and in the CMP portion 605, the plated copper layer is removed from the surface of the semiconductor substrate W, leaving a portion of the plated copper layer in the interconnection groove and the interconnection hole.

Then, the semiconductor substrate W, from which the unwanted plated copper layer has been removed leaving a portion of the plated copper layer-in the interconnection portion including the interconnection groove and the interconnection hole, is transferred to the rinsing chamber 606 and the rinsing chamber 607 by the substrate transferring means and rinsed therein. The rinsed semiconductor substrate W is dried in the drying chamber 608, and the dried semiconductor substrate W is placed into a substrate cassette 609-1 in the unloading portion 609 as a semiconductor substrate on which the interconnection layer has been formed.

Figure 17:
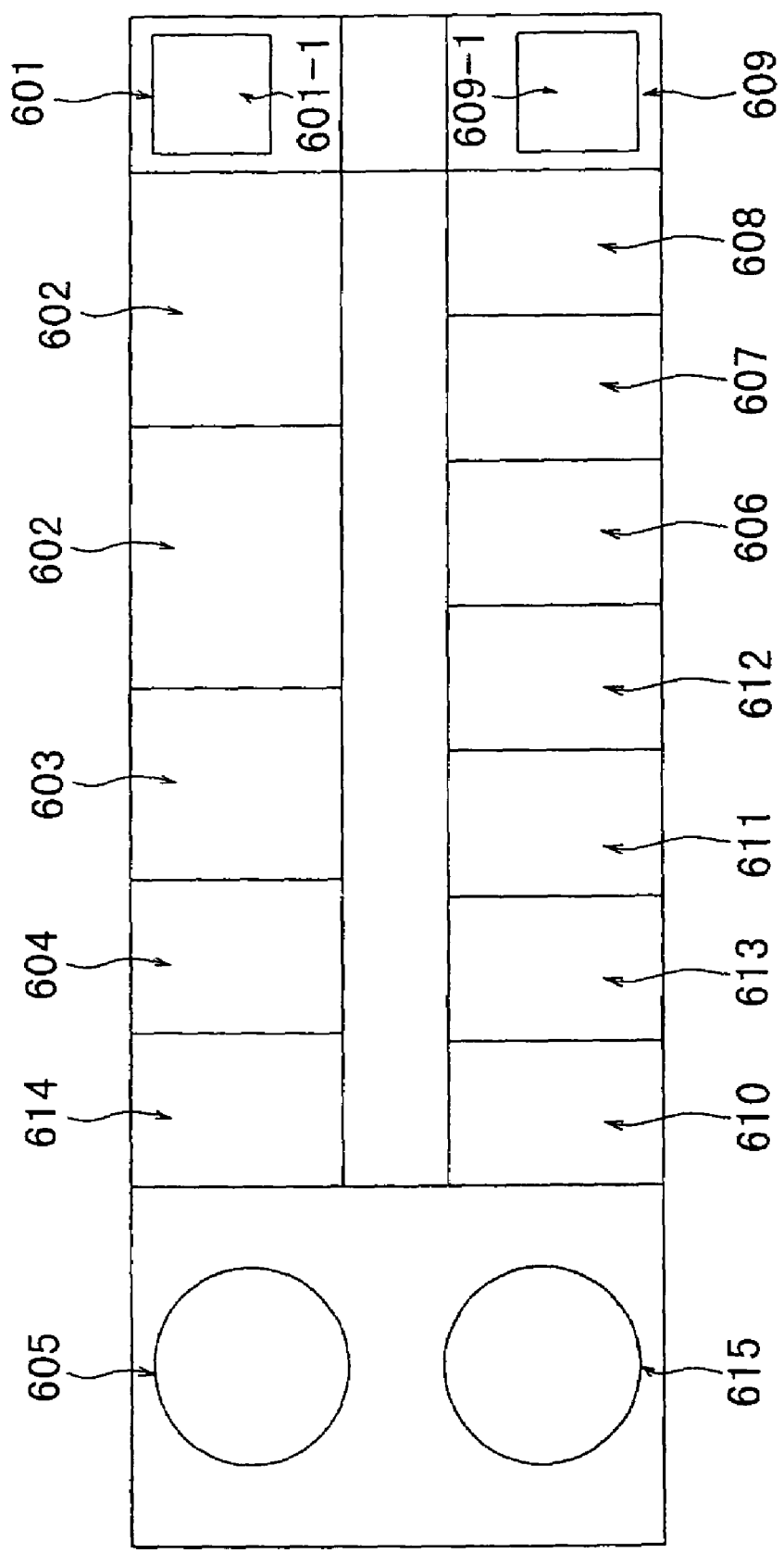
FIG. 17 is a plan view showing still another example of a substrate processing mechanism.

FIG. 17 is a plan view showing another substrate processing mechanism for semiconductor substrate interconnections. The substrate processing mechanism shown in FIG. 17 differs from the substrate processing mechanism shown in FIG. 16 in that it additionally comprises a copper plating chamber 602, a cover plating chamber 612 for forming a protective film on a surface of a plated copper film, a CMP portion 615, and rinsing chambers 613, 614, and the components including these are combined into a single unitary apparatus.

In the substrate processing mechanism thus constructed, a plated copper layer is formed on a surface of the semiconductor substrate W having an interconnection portion including an interconnection groove and an interconnection hole (contact hole). Subsequently, in the CMP portion 605, the plated copper layer is removed from the surface of the semiconductor substrate W, leaving a portion of the plated copper layer in the interconnection groove and the interconnection hole.

Then, the semiconductor substrate W, from which the plated copper layer has been removed leaving a portion of the plated copper layer in the interconnection portion including the interconnection groove and the interconnection hole, is transferred to the rinsing chamber 610 and rinsed therein. Subsequently, pretreatment for cover plating, which will be described below, is performed in the pretreatment chamber 611. The semiconductor substrate W which has been subject to the pretreatment is transferred to the cover plating chamber 612, where a protective film is formed on a plated copper layer formed on the interconnection portion. For example, a Ni—B electroless plating chamber is used as the protective film. After formation of the protective film, the semiconductor substrate W is rinsed in the rinsing chambers 606, 607 and then dried in the drying chamber 608.

Then, an upper portion of the protective film formed on a plated copper layer is polished and planarized in the CMP portion 615, and the semiconductor substrate is rinsed in the rinsing chambers 613, 614, and placed into the substrate cassette 609-1 in the unload portion 609.

Figure 18:
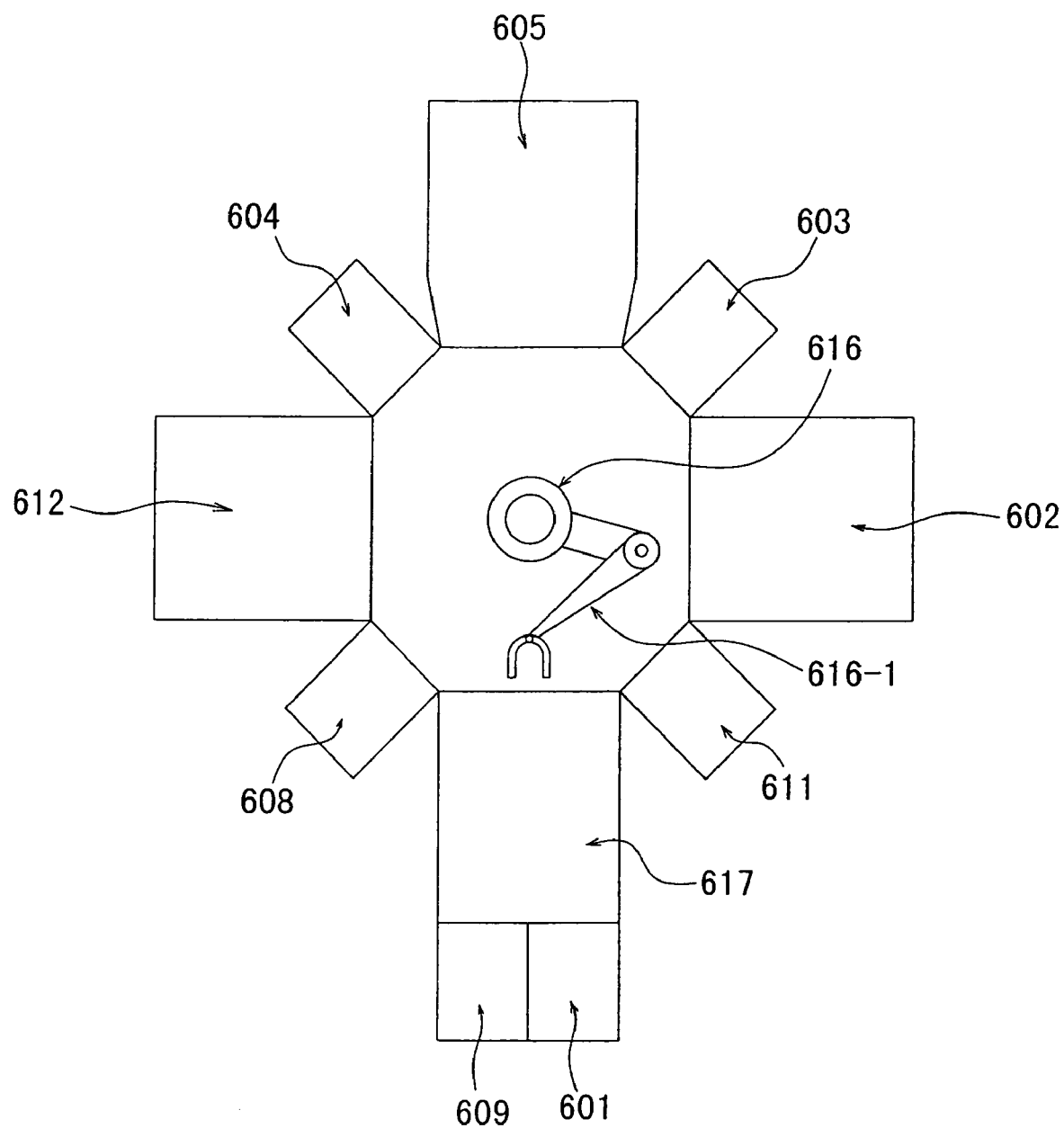
FIG. 18 is a plan view showing still another example of a substrate processing mechanism.

FIG. 18 is a plan view showing another substrate processing mechanism for semiconductor substrate interconnections. As shown in FIG. 18, the substrate processing mechanism comprises a robot 616 at its center, a copper plating chamber 602 disposed at a position to which a robot arm 616-1 of the robot 616 is accessible for performing copper plating, a rinsing chamber 603, a rinsing chamber. 604, a CMP portion 605, a cover plating chamber 612, a drying chamber 608, and a loading/unloading portion 617. A loading portion 601 and an unloading portion 609 for semiconductor substrates are disposed adjacent to the loading/unloading portion 617.

In the substrate processing mechanism thus constructed for semiconductor substrate interconnections, a semiconductor substrate, which has not been subject to interconnection plating, is transferred from the loading portion 601 for substrates to the loading/unloading portion 617, and the robot arm 616-1 receives the semiconductor substrate and transfers it to the copper plating chamber 602, where a plated copper layer is formed on a surface of the semiconductor substrate having an interconnection portion including an interconnection groove and an interconnection hole. The semiconductor substrate on which the plated copper layer has been formed is transferred by the robot arm 616-1 to the CMP portion 605, where the plated copper layer is removed from the surface of the semiconductor substrate W, leaving a portion of the plated copper layer in the interconnection portion including the interconnection groove and the interconnection hole.

The semiconductor substrate W from which the unwanted plated copper layer has been removed is transferred by the robot arm 616-1 to the rinsing chamber 604 and rinsed therein. Then, the semiconductor substrate W is transferred to the pretreatment chamber 611, where pretreatment before cover plating is performed. The semiconductor substrate W which has been subject to the pretreatment is transferred by the robot arm 616-1 to the cover plating chamber 612, where a protective film is formed on a plated copper layer formed on the interconnection portion including the interconnection groove and the interconnection hole. The semiconductor substrate on which the protective film has been formed is transferred by the robot arm 616-1 to the rinsing chamber 604 and rinsed therein. Then, the semiconductor substrate is transferred to the drying chamber 608, dried therein, and transferred to the loading/unloading portion 617. The semiconductor substrate which has been subject to interconnection plating is transferred to the unloading portion 609.

Figure 19:
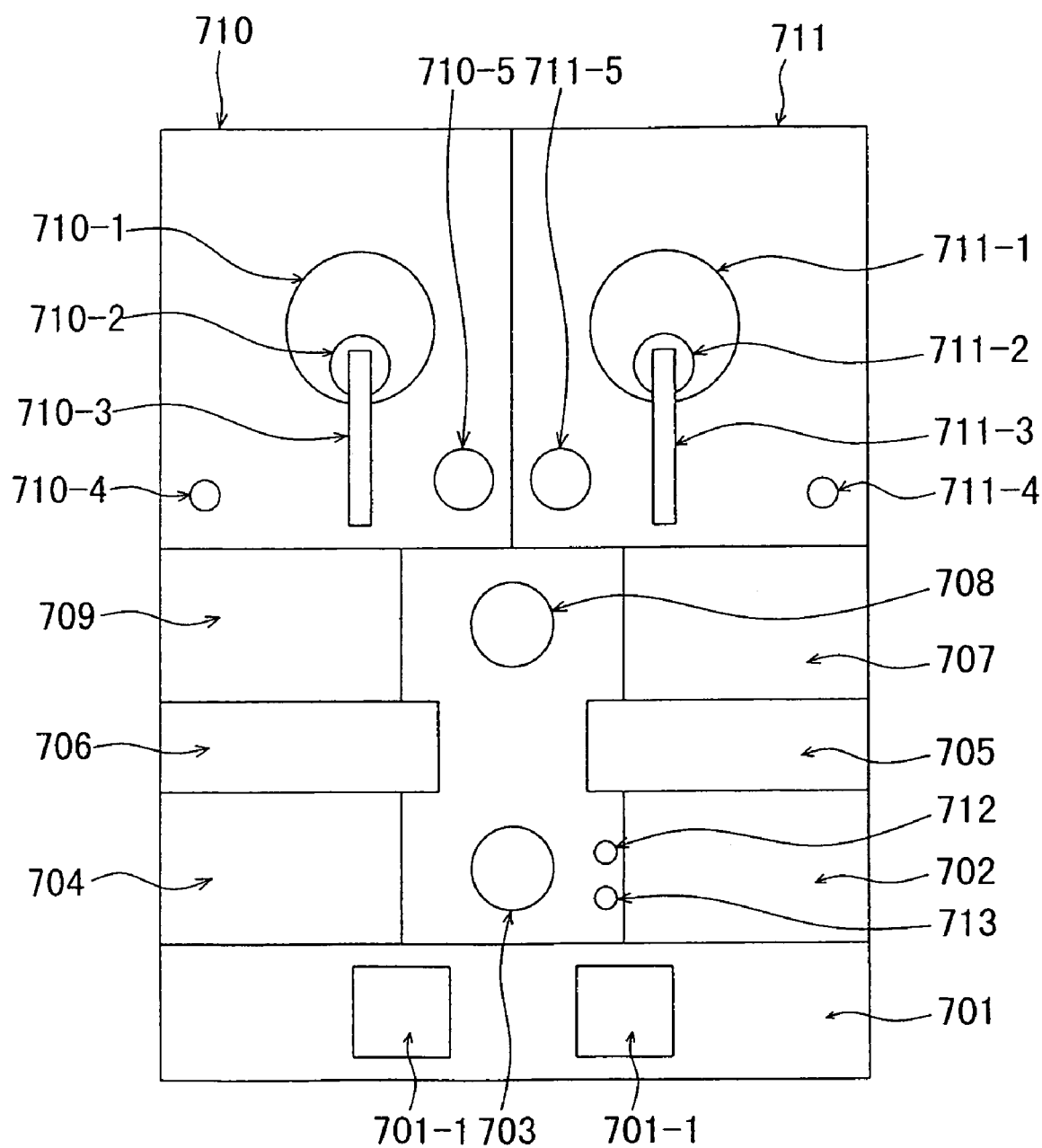
FIG. 19 is a plan view showing still another example of a substrate processing mechanism.

FIG. 19 is a plan view showing another semiconductor substrate processing mechanism. The semiconductor substrate processing mechanism comprises a loading/unloading portion 701, a copper plating unit 702, a first robot 703, a third cleaning machine 704, a reversing machine 705, a reversing machine 706, a second cleaning machine 707, a second robot 708, a first cleaning machine 709, a first polishing apparatus 710, and a second polishing apparatus 711. A before-plating and after-plating film thickness measuring instrument 712 for measuring the film thicknesses before and after plating, and a dry state film thickness measuring instrument 713 for measuring the film thickness of a semiconductor substrate W in a dry state-after polishing are disposed near the first robot 703.

The first polishing apparatus (polishing unit) 710 comprises a polishing table 710-1, a top ring 710-2, a top ring head 710-3, a film thickness measuring instrument 710-4, and a pusher 710-5. The second polishing apparatus (polishing unit) 711 comprises a polishing table 711-1, a top ring 711-2, a top ring head 711-3, a film thickness measuring instrument 711-4, and a pusher 711-5.

A cassette 701-1 accommodating semiconductor substrates W, in which a contact hole and a groove for interconnection are formed, and a seed layer is formed thereon, is placed on a loading port of the loading/unloading portion 701. The first robot 703 takes out a semiconductor substrate W from the cassette 701-1 and transfers it to the copper plating unit 702, where a plated copper film is formed. At that time, the film thickness of the seed layer is measured with the before-plating and after-plating film thickness measuring instrument 712. The plated copper film is formed by performing hydrophilic treatment of a surface of the semiconductor substrate W, and then performing copper plating. After formation of the plated copper film, rinsing or cleaning is performed in the copper plating unit 702. If there is enough time, drying may be performed.

When the semiconductor substrate W is taken out from the copper plating unit 702 by the first robot 703, the film thickness of the plated copper film is measured with the before-plating and after-plating film thickness measuring instrument 712. The measurement results are recorded into a recording device (not shown) as record data on the semiconductor substrate, and are used for judgment of an abnormality of the copper plating unit 702. After measurement of the film thickness, the first robot 703 transfers the semiconductor substrate W to the reversing machine 705, which reverses the semiconductor substrate W (the surface on which the plated copper film has been formed faces downward). The first polishing apparatus 710 and the second polishing apparatus. 711 perform polishing in a serial mode and a parallel mode. Polishing in the serial mode will be described below.

In the serial mode polishing, primary polishing is performed by the polishing apparatus 710, and secondary polishing is performed by the polishing apparatus 711. The second robot 708 picks up the semiconductor substrate W on the reversing machine 705 and places the semiconductor substrate W on the pusher 710-5 of the polishing apparatus 710. The top ring 710-2 attracts the semiconductor substrate W on the pusher 710-5 by suction and brings the surface of the plated copper film of the semiconductor substrate W into contact with a polishing surface of the polishing table 710-1 under pressure to perform primary polishing. With the primary polishing, the plated copper film is basically polished. The polishing surface of the polishing table 710-1 is formed of foamed polyurethane such as IC1000, or a material having abrasive particles fixed thereto or impregnated therein. The plated copper film is polished by relative movements of the polishing surface and the semiconductor substrate W.

After completion of polishing of the plated copper film, the semiconductor substrate W is returned onto the pusher 710-5 by the top ring 710-2. The second robot 708 picks up the semiconductor substrate W and introduces it into the first cleaning machine 709. At that time, a chemical liquid may be ejected toward the front and rear faces of the semiconductor substrate W on the pusher 710-5 to remove particles therefrom or prevent particles from being attached thereto.

After completion of cleaning in the first cleaning machine 709, the second robot 708 picks up the semiconductor substrate W and places the semiconductor substrate W on the pusher 711-5 of the second polishing apparatus 711. The top ring 711-2 attracts the semiconductor substrate W on the pusher 711-5 by suction and brings the surface of the semiconductor substrate W, on which the barrier layer has been formed, into contact with the polishing surface of the polishing table 711-1 under pressure to perform the secondary polishing. With this secondary polishing, the barrier layer is polished. However, there may be cases in which a copper film and an oxide film left after the primary polishing are also polished.

A polishing surface of the polishing table 711-1 is formed of foamed polyurethane such as IC1000, or a material having abrasive particles fixed thereto or impregnated therein. Polishing is performed by relative movements of the polishing surface and the semiconductor substrate W. At that time, silica, alumina, ceria, or the like is used as abrasive particles or slurry. A chemical liquid is adjusted depending on the type of the film to be polished.

Detection of an end point of the secondary polishing is performed by measuring the film thickness of the barrier layer with the use of the optical film thickness measuring instrument, and detecting whether the film thickness becomes zero, or whether the surface of an insulating film of $SiO_2$ is exposed. Furthermore, a film thickness measuring instrument with an image processing function is used as the film thickness measuring instrument 711-4 provided near the polishing table 711-1. By use of this measuring instrument, measurement of the oxide film is performed, the results are stored as processing records of the semiconductor substrate W and used for judging whether the semiconductor substrate W, which has been subject to secondary polishing, can be transferred to a subsequent step. If the end point of the secondary polishing is not reached, re-polishing of the semiconductor substrate W is performed. If over-polishing of the semiconductor substrate W has been performed beyond a prescribed value due to any abnormality, then the semiconductor substrate processing mechanism is stopped to avoid the next polishing operation so that defective products will not increase.

After completion of the secondary polishing, the semiconductor substrate W is moved to the pusher 711-5 by the top ring 711-2. The second robot 708 picks up the semiconductor substrate W on the pusher 711-5. At that time, a chemical liquid may be ejected toward the front and rear faces of the semiconductor substrate W on the pusher 711-5 to remove particles therefrom or prevent particles from being attached thereto.

The second robot 708 transfers the semiconductor substrate W into the second cleaning machine 707, where the semiconductor substrate W is cleaned. The constitution of the second cleaning machine 707 is also the same as the constitution of the first cleaning machine 709. The surface of the semiconductor substrate W is scrubbed with the PVA sponge rolls using a cleaning liquid including pure water to which a surface active agent, a chelating agent, and a pH regulating agent are added. A strong chemical liquid such as DHF is ejected from a nozzle toward the rear face of the semiconductor substrate W to perform etching of the diffused copper thereon. If there is no problem of diffusion, scrubbing cleaning is performed with the PVA sponge rolls using the same chemical liquid as that used for the front face.

After completion of the above cleaning, the second robot 708 picks up the semiconductor substrate W and transfers it to the reversing machine 706, which reverses the semiconductor substrate W. The semiconductor substrate W, which has been reversed, is picked up by the first robot 703 and transferred to the third cleaning machine 704. In the third cleaning machine 704, megasonic water excited by ultrasonic vibrations is ejected toward the surface of the semiconductor substrate W to clean the semiconductor substrate W. At that time, the surface of the semiconductor substrate W may be cleaned with a known pencil-type sponge using a cleaning liquid including pure water to which a surface active agent, a chelating agent, and a pH regulating agent are added. Thereafter, the semiconductor substrate W is dried by spin-drying.

As described above, if the film thickness has been measured with the film thickness measuring instrument 711-4 provided near the polishing table 711-1, then the semiconductor substrate W is directly placed into the cassette placed on the unloading port of the loading/unloading portion 701.

Figure 20:
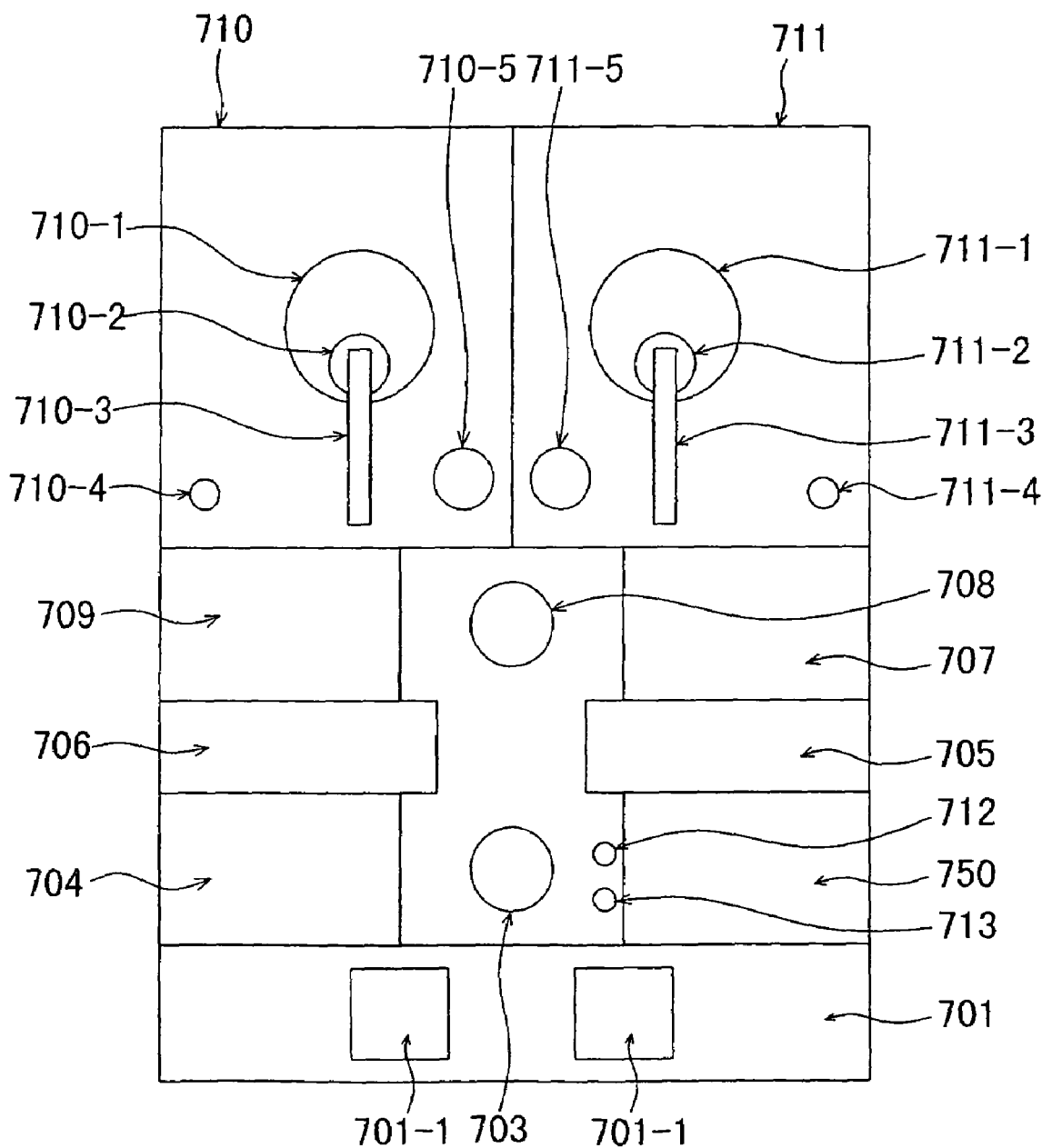
FIG. 20 is a plan view showing still another example of a substrate processing mechanism.

FIG. 20 is a plan view showing another semiconductor substrate processing mechanism. The semiconductor substrate processing mechanism differs from the semiconductor substrate processing mechanism in FIG. 19 in that a cover plating unit 750 is provided instead of the copper plating unit 702 shown in FIG. 19.

A cassette 701-1 accommodating semiconductor substrates W on which a copper film is formed is placed on a loading/unloading portion 701. A semiconductor substrate W is taken out from the cassette 701-1 and transferred to the first polishing apparatus 710 or the second polishing apparatus 711, where the surface of the copper film is polished. After completion of polishing, the semiconductor substrate W is transferred to the first cleaning machine 709 and cleaned therein.

The semiconductor substrate W, which has been cleaned in the first cleaning machine 709, is transferred to the cover plating unit 750 where a protective film is formed on a surface of the plated copper film to prevent oxidation of plated copper film under an atmosphere. The semiconductor substrate W, which has been subject to cover plating, is transferred by the second robot 708 from the cover plating unit 750 to the second cleaning machine 707, where the semiconductor substrate is cleaned with pure water or deionized water. The cleaned semiconductor substrate is returned into the cassette 701-1 placed on the loading/unloading portion 701.

Figure 21:
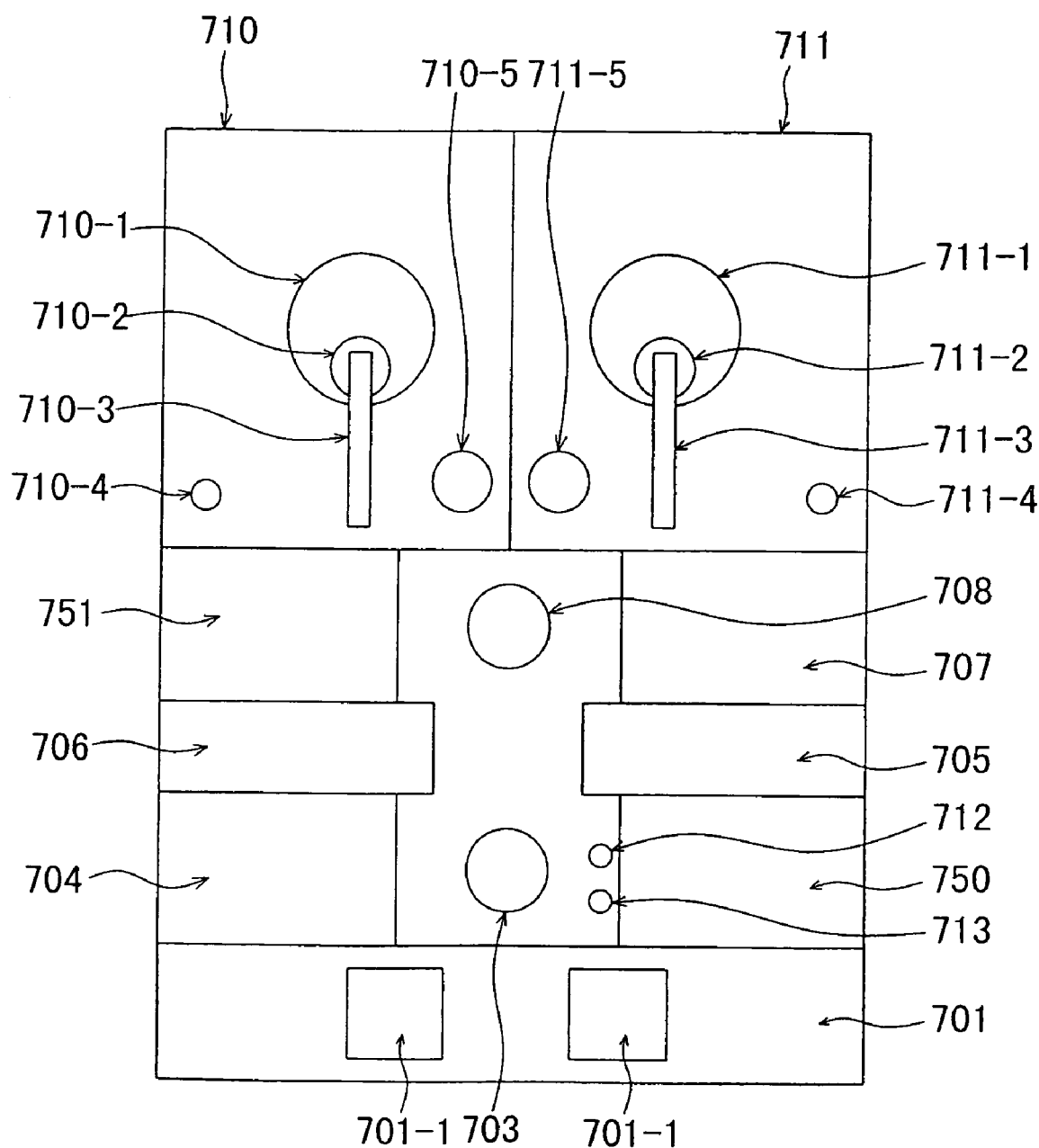
FIG. 21 is a plan view showing still another example of a substrate processing mechanism.

FIG. 21 is a plan view showing another semiconductor substrate processing mechanism. The semiconductor substrate processing mechanism differs from the semiconductor substrate processing mechanism shown in FIG. 20 in that an annealing unit 751 is provided instead of the first cleaning machine 709 shown in FIG. 20.

The semiconductor substrate W, which is polished in the first polishing unit 710 or the second polishing unit 711 and cleaned in the second cleaning machine 707 as described above, is transferred to the cover plating unit 750, where the surface of the plated copper film is subject to cover plating. The semiconductor substrate, which has been subject to cover plating, is transferred by the first robot 703 from the cover plating unit 750 to the third cleaning machine 704, where the semiconductor substrate is cleaned.

The semiconductor substrate W, which has been cleaned in the first cleaning machine 709, is transferred to the annealing unit 751 and annealed therein. With annealing, the plated copper film is alloyed so as to increase the electromigration resistance of the plated copper film. The semiconductor substrate W, which has been subject to annealing treatment, is transferred from the annealing unit 751 to the second cleaning machine 707, where the semiconductor substrate is cleaned with pure water or deionized water. The cleaned semiconductor substrate W is returned into the cassette 701-1 placed on the loading and unloading section 701.

Figure 22:
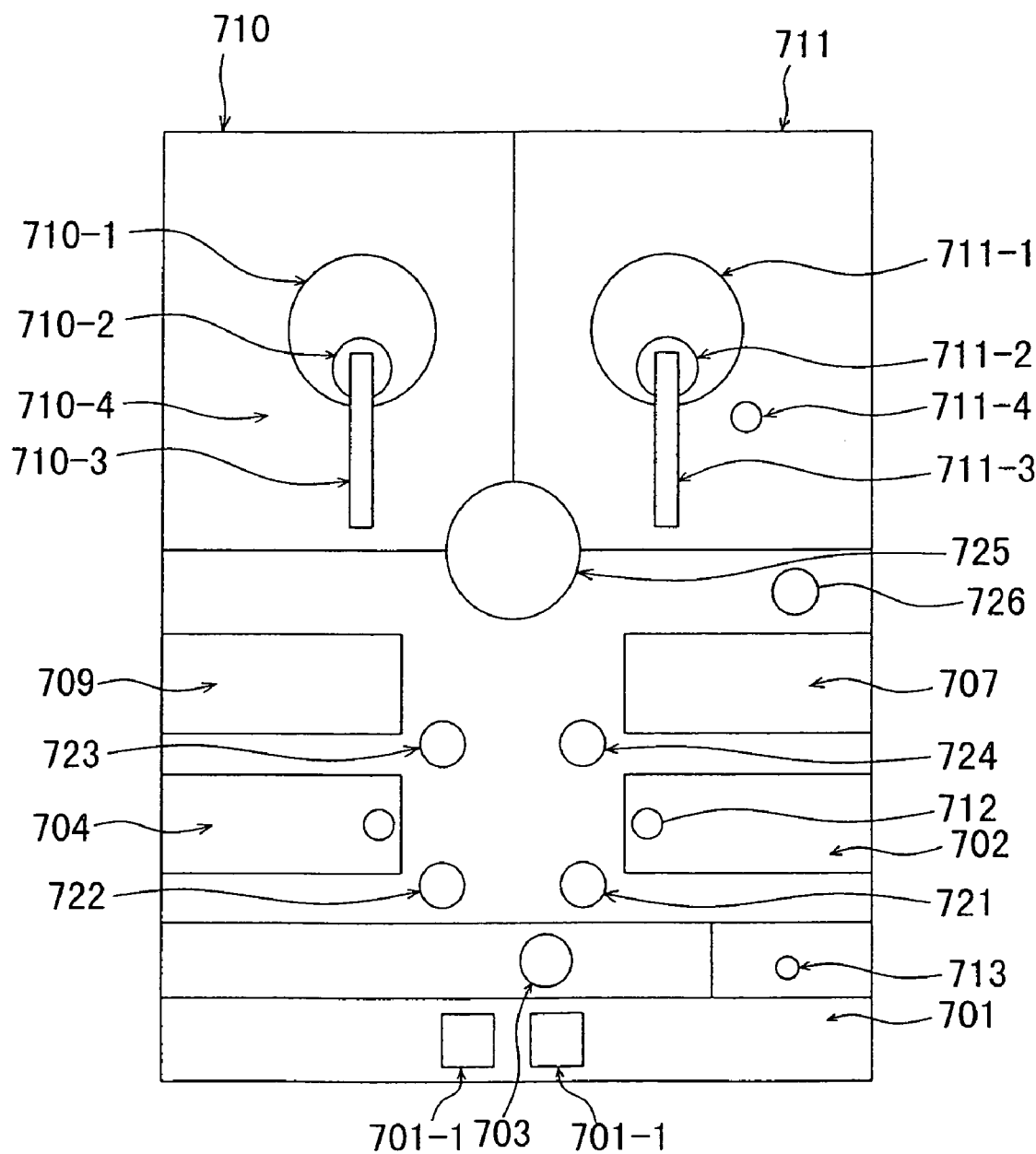
FIG. 22 is a plan view showing still another example of a substrate processing mechanism.

FIG. 22 is a plan view showing another substrate processing mechanism. In FIG. 22, portions denoted by the same reference numerals as those in FIG. 19 show the same or corresponding portions. The substrate processing mechanism comprises a pusher indexer 725 disposed close to a first polishing apparatus 710 and a second polishing apparatus 711, substrate placing tables 721, 722 disposed close to a third cleaning machine 704 and a copper plating unit 702, respectively, a robot 723 disposed close to a first cleaning machine 709 and the third cleaning machine 704, a robot 724 disposed close to a second cleaning machine 707 and the copper plating unit 702, and a dry state film thickness measuring instrument 713 disposed close to a loading/unloading portion 701 and a first robot 703.

In the substrate processing mechanism thus constructed, the first robot 703 takes out a semiconductor substrate W from a cassette 701-1 placed on a load port of the loading/unloading portion 701. After the film thicknesses of a barrier layer and a seed layer are measured with the dry state film thickness measuring instrument 713, the first robot 703 places the semiconductor substrate W on the substrate placing table 721. In the case where the dry state film thickness measuring instrument 713 is provided on a hand of the first robot 703, the film thicknesses are measured thereon, and the substrate is placed on the substrate placing table 721. The second robot 723 transfers the semiconductor substrate W on the substrate placing table 721 to the copper plating unit 702, where a plated copper film is formed. After formation of the plated copper film, the film thickness of the plated copper film is measured with a before-plating and after-plating film thickness measuring instrument 712. Then, the second robot 723 transfers the semiconductor substrate W to the pusher indexer 725 and loads the semiconductor substrate W thereon.

[Serial Mode]

In the serial mode, a top ring head 710-2 attracts the semiconductor substrate W on the pusher indexer 725 by suction, transfers it to a polishing table 710-1, and presses the semiconductor substrate W against a polishing surface on the polishing table 710-1 to perform polishing. Detection of the end point of polishing is performed by the same method as described above. The semiconductor substrate W which has been polished is transferred to the pusher indexer 725 by the top ring head 710-2 and loaded thereon. The second robot 723 takes out the semiconductor substrate W and transfers it into the first cleaning machine 709, where semiconductor substrate W is cleaned. Then, the semiconductor substrate W is transferred to the pusher indexer 725 and loaded thereon.

A top ring head 711-2 attracts the semiconductor substrate W on the pusher indexer 725 by suction, transfers it to a polishing table 711-1, and presses the semiconductor substrate W against a polishing surface on the polishing table 711-1 to perform polishing. Detection of the end point of polishing is performed by the same method as described above. The semiconductor substrate W, which has been polished, is transferred to the pusher indexer 725 by the top ring head 711-2 and loaded thereon. The third robot 724 picks up the semiconductor substrate W, and its film thickness is measured with a film thickness measuring instrument 726. Then, the semiconductor substrate W is transferred into the-second cleaning machine 707, where the semiconductor substrate W is cleaned. Thereafter, the semiconductor substrate W is transferred into the third cleaning machine 704, where the semiconductor substrate W is cleaned and then dried by spin-drying. Then, the semiconductor substrate W is picked up by the third robot 724 and placed on the substrate placing table 722.

[Parallel Mode]

In the parallel mode, the top ring head 710-2 or 711-2 attracts the semiconductor substrate W on the pusher indexer 725 by suction, transfers it to the polishing table 710-1 or 711-1, and presses the semiconductor substrate W against the polishing surface on the polishing table 710-1 or 711-1 to perform polishing. After measurement of the film thickness, the third robot 724 picks up the semiconductor substrate W and places the semiconductor substrate W on the substrate placing table 722.

The first robot 703 transfers the semiconductor substrate W on the substrate placing table 722 to the dry state film thickness measuring instrument 713. After the film thickness is measured, the semiconductor substrate W is returned to the cassette 701-1 on the loading and unloading section 701.

Figure 23:
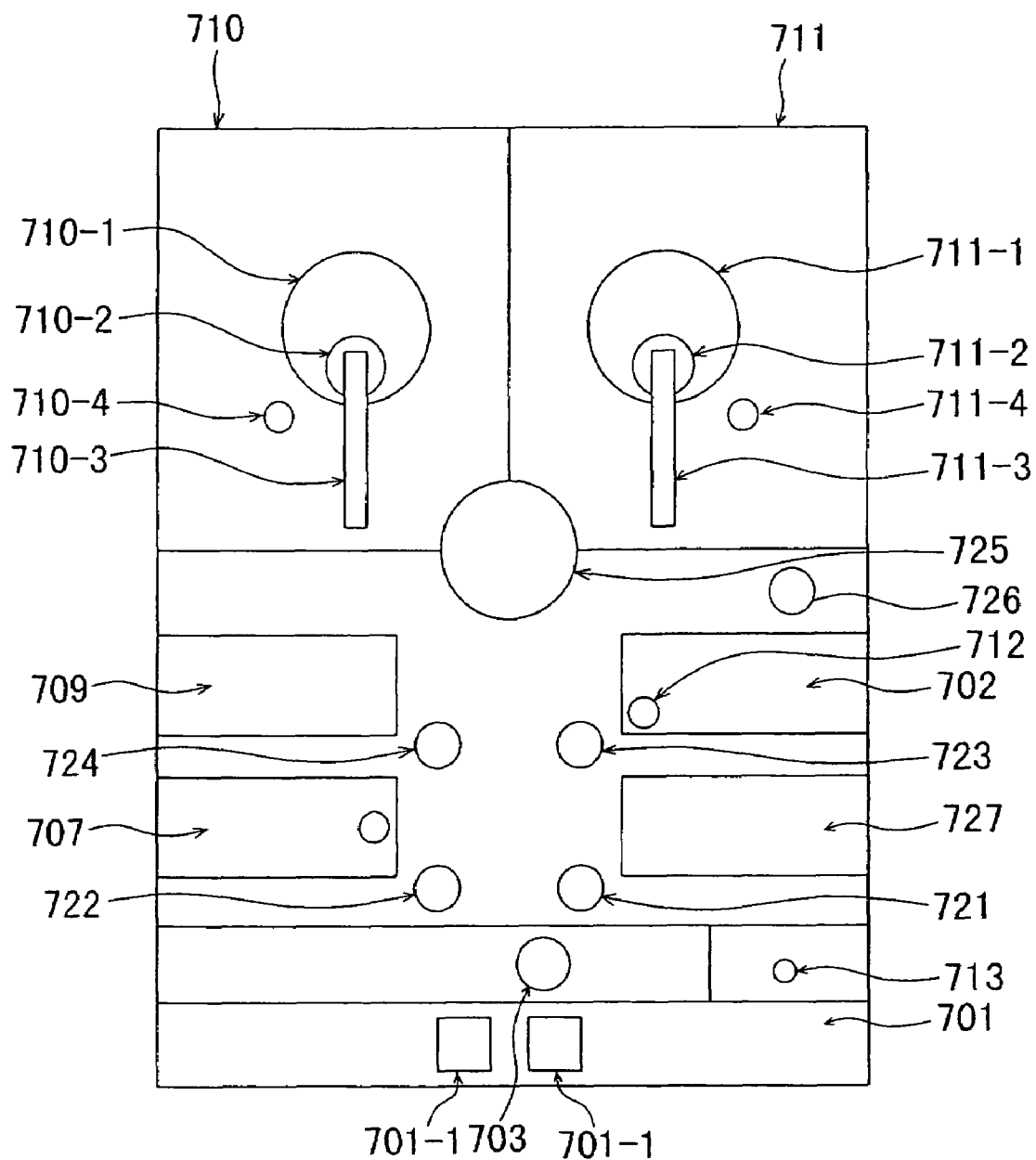
FIG. 23 is a plan view showing still another example of a substrate processing mechanism.

FIG. 23 is a plan view showing another substrate processing mechanism. The substrate processing mechanism is a substrate processing mechanism which forms a seed layer and a plated copper film on a semiconductor substrate W having no seed layer formed thereon, and polishes these films to form circuit interconnections.

The substrate processing mechanism comprises a pusher indexer 725 disposed close to a first polishing apparatus 710 and a second polishing apparatus 711, substrate placing tables 721, 722 disposed close to a second cleaning machine 707 and a seed layer forming unit 727, respectively, a robot 723 disposed close to the seed layer forming unit 727 and a copper plating unit 702, a robot 724 disposed close to a first cleaning machine 709 and the second cleaning machine 707, and a dry state film thickness measuring instrument 713 disposed close to a loading/unloading portion 701 and a first robot 703.

The first robot 703 takes out a semiconductor substrate W having a barrier layer thereon from a cassette 701-1 placed on a load port of the loading and unloading section 701 and places it on the substrate placing table 721. Then, the second robot 723 transfers the semiconductor substrate W to the seed layer forming unit 727, where a seed layer is formed on the semiconductor substrate W. The seed layer is formed by electroless plating. The second robot 723 transfers the semiconductor substrate having the seed layer formed thereon to the before-plating and after-plating film thickness measuring instrument 712, where the film thickness of the seed layer of the semiconductor substrate W is measured. After measurement of the film thickness, the semiconductor substrate is transferred into the copper plating unit 702, where a plated copper film is formed.

After formation of the plated copper film, the film thickness of the plated copper film is measured, and the semiconductor substrate is transferred to a pusher indexer 725. A top ring 710-2 or 711-2 attracts the semiconductor substrate W on the pusher indexer 725 by suction and transfers it to a polishing table 710-1 or 711-1 to perform polishing. After polishing, the top ring 710-2 or 711-2 transfers the semiconductor substrate W to a film thickness measuring instrument 710-4 or 711-4, where the film thickness is measured, and transfers the semiconductor substrate W to the pusher indexer 725 and places it thereon.

Next, the third robot 724 picks up the semiconductor substrate W from the pusher indexer 725 and transfers it into the first cleaning machine 709. The third robot 724 picks up the cleaned semiconductor substrate W from the first cleaning machine 709, transfers it into the second cleaning machine 707, and places the cleaned and dried semiconductor substrate on the substrate placing table 722. Next, the first robot 703 picks up the semiconductor substrate W, transfers it to the dry state film thickness measuring instrument 713, where the film thickness is measured, and transfers it into the cassette 701-1 placed on an unload port of the loading/unloading portion 701.

In the substrate processing mechanism shown in FIG. 23, circuit interconnections may be formed by forming a barrier layer, a seed layer and a plated copper film on a semiconductor substrate W having a contact hole or a groove of a circuit pattern formed therein, and polishing them.

The cassette 701-1 accommodating semiconductor substrates W on which a barrier layer has not been formed is placed on a load port of the loading/unloading portion 701. The first robot 703 takes out a semiconductor substrate W from the cassette 701-1 placed on the load port of the loading/unloading portion 701 and places it on the substrate placing table 721. Then, the second robot 723 transfers the semiconductor substrate W to the seed layer forming unit 727, where a barrier layer and a seed layer are formed on the semiconductor substrate W. The barrier layer and the seed layer are formed by electroless plating. The second robot 723 transfers the semiconductor substrate W to the before-plating and after-plating film thickness measuring instrument 712, which measures the film thicknesses of the barrier layer and the seed layer. After measurement of the film thicknesses, the semiconductor substrate W is transferred into the copper plating unit 702, where a plated copper film is formed.

Figure 24:
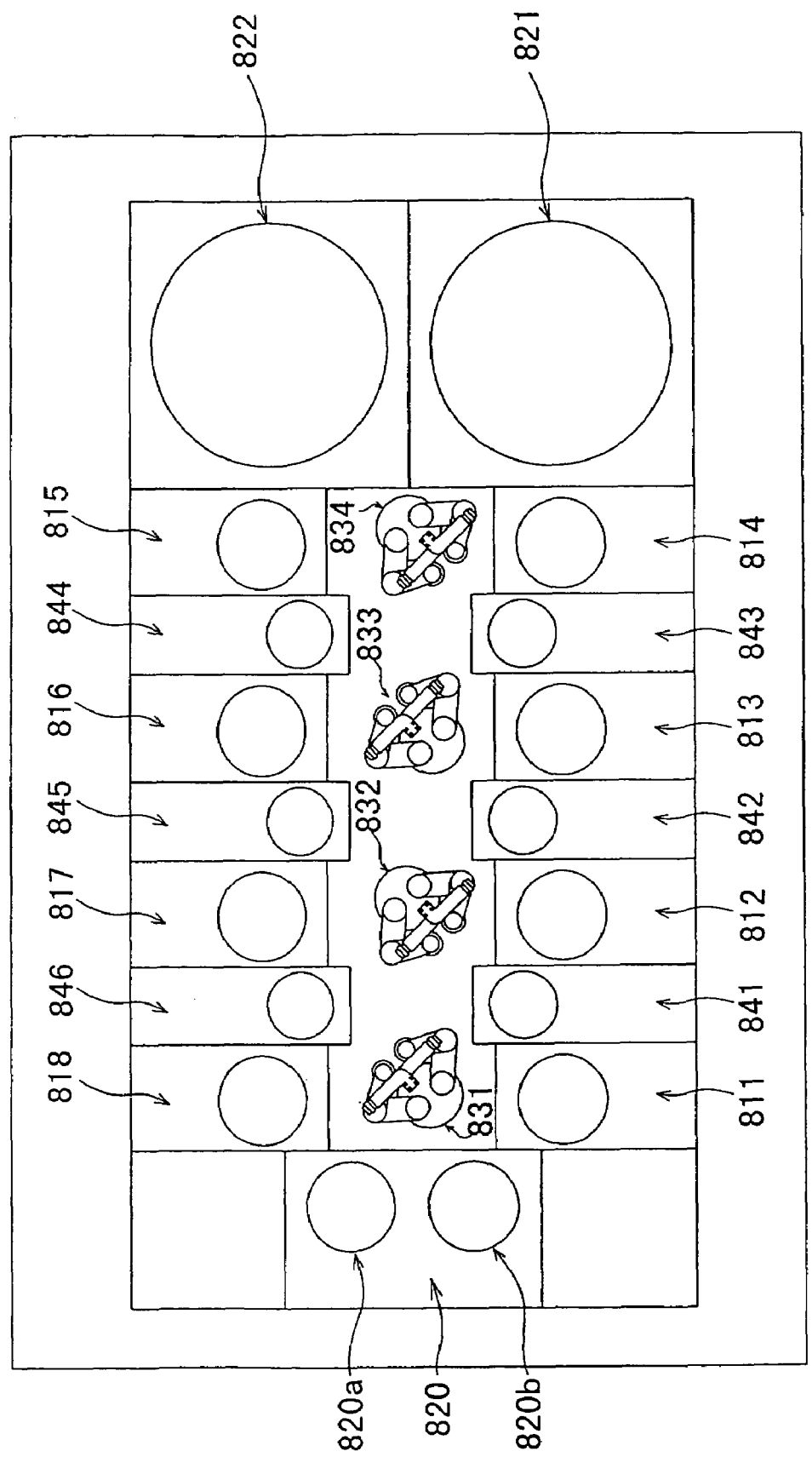
FIG. 24 is a plan view showing still another example of a substrate processing mechanism.

FIG. 24 is a plan view showing another substrate processing mechanism. The substrate processing mechanism comprises a barrier layer forming unit 811, a seed layer forming unit 812, a plating unit 813, an annealing unit 814, a first cleaning unit 815, a bevel/backside cleaning unit 816, a cover plating unit 817, a second cleaning unit 818, a first aligner and film thickness measuring instrument 841, a second aligner and film thickness measuring instrument 842, a first substrate reversing machine 843, a second substrate reversing machine 844, a substrate temporary placing stage 845, a third film thickness measuring instrument 846, a loading and unloading section 820, a first polishing apparatus 821, a second polishing apparatus 822, a first robot 831, a second robot 832, a third robot 833, and a fourth robot 834. The film thickness measuring instruments 841, 842 and 846 are unitized and have the same size as the front dimension of other units (plating, cleaning, annealing units, and the like), so that the film thickness measuring instruments 841; 842 and 846 are interchangeable.

In this example, an electroless Ru plating apparatus can be used as the barrier layer forming unit 811, an electroless copper plating apparatus as the seed layer forming unit 812, and an electrolytic plating apparatus as the plating unit 813.

Figure 25:
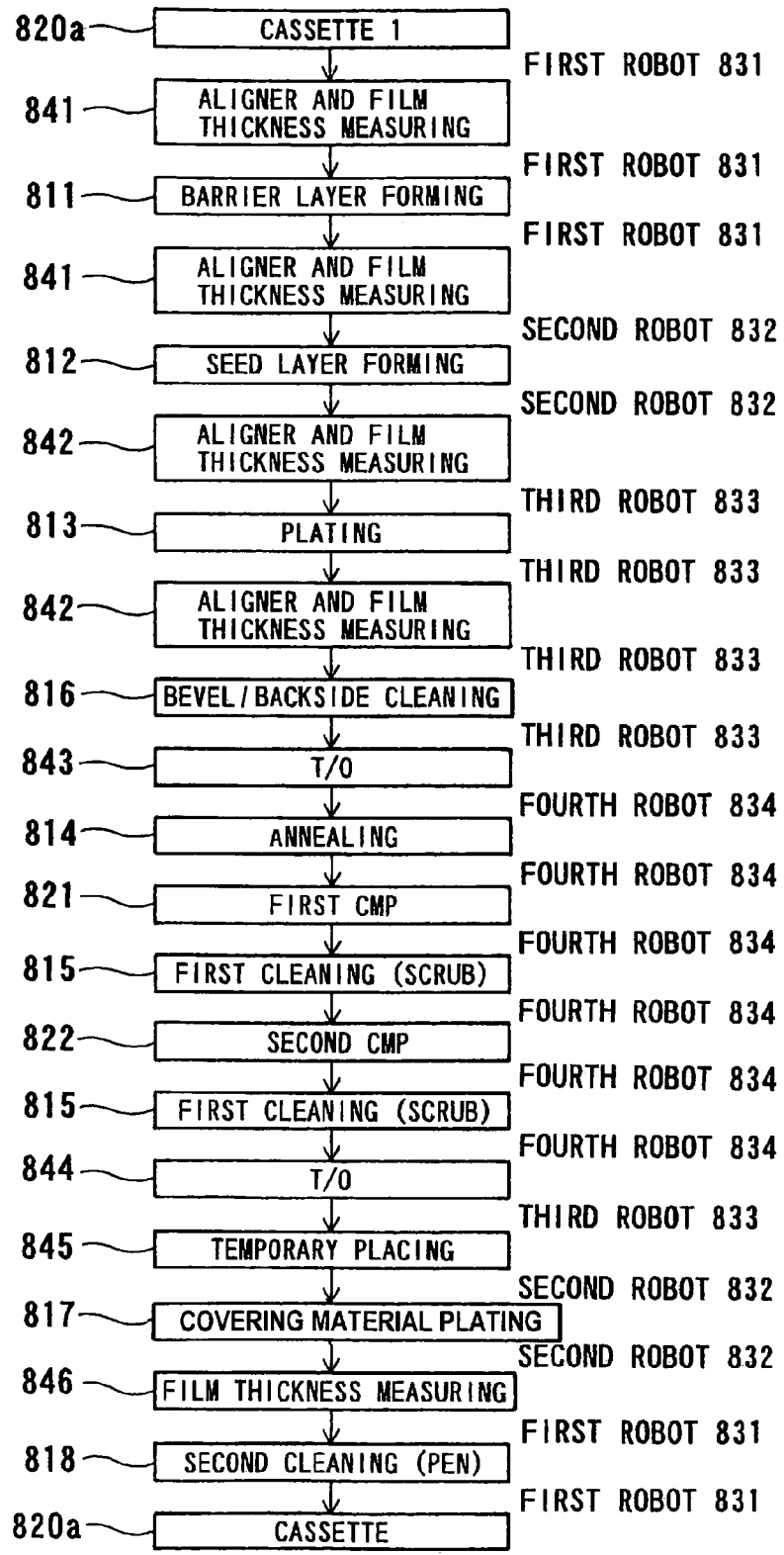
FIG. 25 is a flow chart showing a flow of respective steps in the substrate processing mechanism shown in FIG. 24.

FIG. 25 is a flow chart showing the flow of the respective steps in the substrate processing mechanism. The respective steps in the apparatus will be described according to this flow chart. First, a semiconductor substrate taken out by the first robot 831 from a cassette 820a placed on the load and unload unit 820 is placed in the first aligner and film thickness measuring instrument 841 in a state such that the surface, to be plated, faces upward. In order to set a reference point for a position at which film thickness is measured, notch alignment for film thickness measurement is performed, and then film thickness data on the semiconductor substrate before formation of a copper film are obtained.

Then, the semiconductor substrate is transferred to the barrier layer forming unit 811 by the first robot 831. The barrier layer forming unit 811 is an apparatus for forming a barrier layer on the semiconductor substrate by electroless Ru plating, and the barrier layer forming unit 811 forms a Ru film as a film for preventing copper from diffusing into an interlayer insulating film (e.g. SiO$_2$) of a semiconductor device. The semiconductor substrate discharged after cleaning and drying steps is transferred by the first robot 831 to the first aligner and film thickness measuring instrument 841, where the film thickness of the semiconductor substrate, i.e., the film thickness of the barrier layer is measured.

The semiconductor substrate after film thickness measurement is transferred into the seed layer forming unit 812 by the second robot 832, where a seed layer is formed on the barrier layer by electroless copper plating. The semiconductor substrate discharged after cleaning and drying steps is transferred by the second robot 832 to the second aligner and film thickness measuring instrument 842 for determination of a notch position, before the semiconductor substrate is transferred to the plating unit 813, which is an impregnation plating unit. Then, notch alignment for copper plating is performed. The film thickness of the semiconductor substrate before formation of a copper film may be measured again as needed.

The semiconductor substrate which has completed notch alignment is transferred by the third robot 833 to the plating unit 813, where copper plating is performed. The semiconductor substrate discharged after cleaning and drying steps is transferred by the third robot 833 to the bevel/backside cleaning unit 816 to remove an unnecessary copper film (seed layer) at a peripheral portion of the semiconductor substrate. In the bevel/backside cleaning unit 816, the bevel is etched for a preset time, and copper attached to the backside of the semiconductor substrate is cleaned with a chemical liquid such as hydrofluoric acid. At that time, before transferring the semiconductor substrate to the bevel/backside cleaning unit 816, film thickness measurement of the semiconductor substrate may be performed by the second aligner and film thickness measuring instrument 842 to obtain the thickness value of the copper film formed by plating, and the bevel etching time may be changed arbitrarily based on the obtained results to perform etching. The region etched by bevel etching is a region which corresponds to a peripheral edge portion of the substrate and has no circuit formed therein, or a region which is not utilized finally as a chip although a circuit is formed. A bevel portion is included in this region.

The semiconductor substrate discharged after cleaning and drying steps in the bevel/backside cleaning unit 816 is transferred by the third robot 833 to the substrate reversing machine 843, and reversed by the substrate reversing machine 843 to cause the plated surface to be directed downward. Then, the semiconductor substrate is introduced into the annealing unit 814 by the fourth robot 834 to stabilize an interconnection portion. Before and/or after annealing treatment, the semiconductor substrate is transferred into the second aligner and film thickness measuring instrument 842, where the film thickness of a copper film formed on the semiconductor substrate is measured. Then, the semiconductor substrate is transferred by the fourth robot 834 into the first polishing apparatus 821, where the copper layer and the seed layer of the semiconductor substrate are polished.

At that time, although desired abrasive particles or the like are used, a fixed abrasive may be used in order to prevent dishing and to enhance flatness of the surface. After completion of primary polishing, the semiconductor substrate is transferred by the fourth robot 834 to the first cleaning unit 815, where the semiconductor substrate is cleaned. This cleaning is scrub-cleaning in which rolls having substantially the same length as the diameter of the semiconductor substrate are placed on the face and the backside of the semiconductor substrate, and the semiconductor substrate and the rolls are rotated while pure water or deionized water is flowed to clean the semiconductor substrate.

After completion of the primary cleaning, the semiconductor substrate is transferred by the fourth robot 834 to the second polishing apparatus 822, where the barrier layer on the semiconductor substrate is polished. At that time, although desired abrasive particles or the like are used, a fixed abrasive may be used in order to prevent dishing and to enhance flatness of the face. After completion of secondary polishing, the semiconductor substrate is transferred by the fourth robot 834 again to the first cleaning unit 815, where scrub-cleaning is performed. After cleaning, the semiconductor substrate is transferred by the fourth robot 834 to the second substrate reversing machine 844, where the semiconductor substrate is reversed to cause the plated surface to be directed upward, and then placed on the substrate temporary placing stage 845 by the third robot 833.

The semiconductor substrate is transferred by the second robot 832 from the substrate temporary placing stage 845 to the cover plating unit 817, where nickel/boron plating is performed on the copper surface to prevent oxidation of copper under an atmosphere. The semiconductor substrate, which has been subject to cover plating, is transferred by the second robot 832 from the cover plating unit 817 to the third film thickness measuring instrument 846, where the thickness of the copper film is measured. Thereafter, the semiconductor substrate is transferred by the first robot 83.1 into the second cleaning unit 818, where the semiconductor substrate is cleaned with pure water or deionized water. The cleaned semiconductor substrate is returned into the cassette 820a placed on the loading/unloading portion 820 by the first robot 831.

The aligner and film thickness measuring instrument 841 and the aligner and film thickness measuring instrument 842 operate to position the notch portion of the substrate and measure the film thickness of the substrate.

Figure 26:
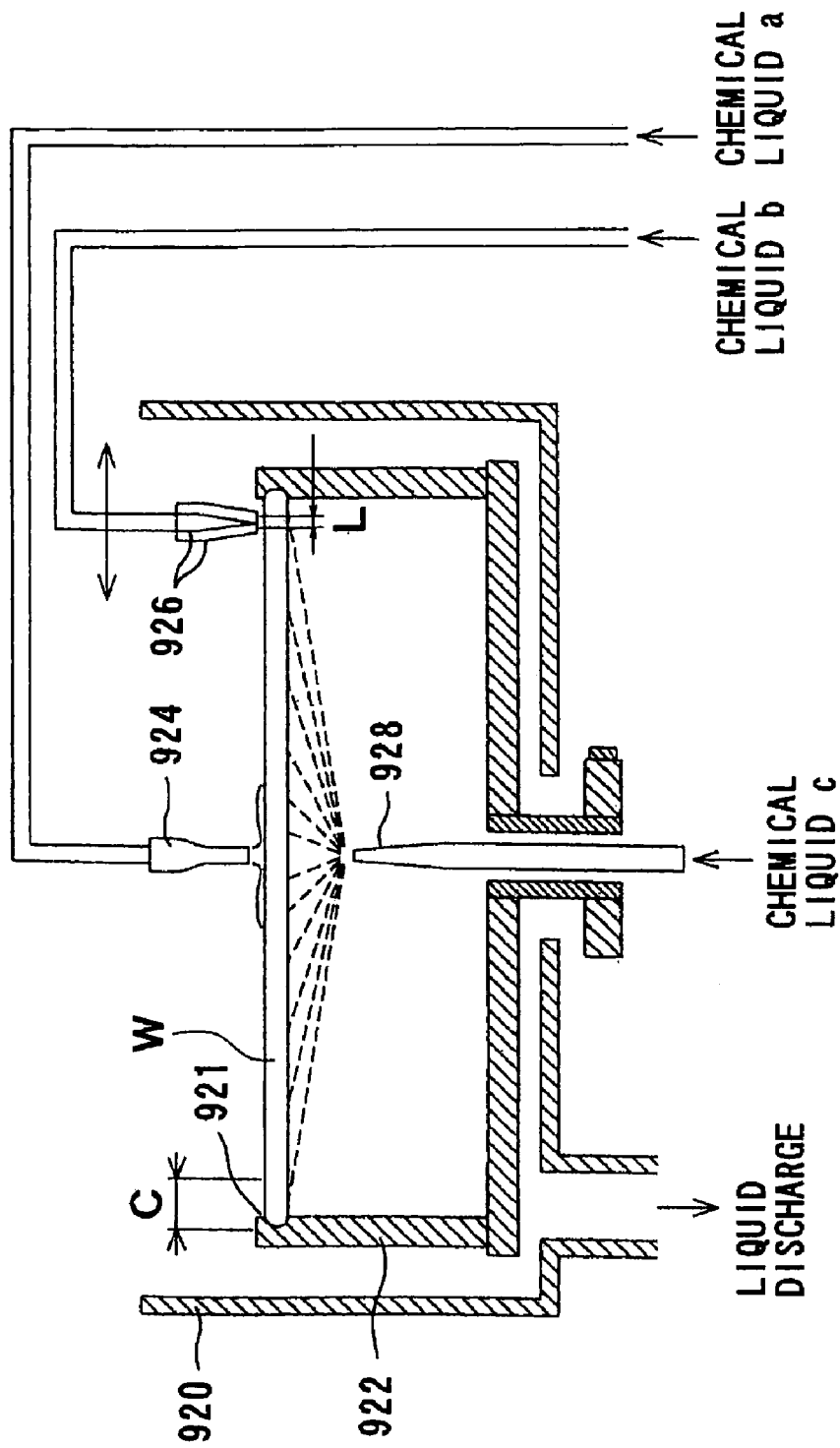
FIG. 26 is a schematic view showing a bevel/backside cleaning unit.

The bevel/backside cleaning unit 816 can perform an edge (bevel) copper etching and a backside cleaning at the same time, and can suppress growth of a natural oxide film of copper at the circuit-formed portion on the surface of the substrate. FIG. 26 is a schematic view of the bevel/backside cleaning unit 816. As shown in FIG. 26, the bevel/backside cleaning unit 816 has a substrate holding portion 922 for holding the substrate W horizontally by spin chucks 921 and rotating the substrate W at a high speed, a center nozzle 924 disposed above a nearly central portion of the face of the substrate W held by the substrate holding portion 922, and an edge nozzle 926 disposed above the peripheral edge portion of the substrate W. The substrate holding portion 922 is positioned inside a bottomed cylindrical waterproof cover 920, and the spin chucks 921 hold the substrate W at a plurality of locations along a circumferential direction of a peripheral edge portion of the substrate in a state such that the face of the substrate W faces upward. The center nozzle 924 and the edge nozzle 926 are directed downward. A back nozzle 928 is positioned below a nearly central portion of the backside of the substrate W, and directed upward. The edge nozzle 926 is adapted to be movable in a diametrical direction and a height direction of the substrate W.

The width L of movement of the edge nozzle 926 is set such that the edge nozzle 926 can be arbitrarily positioned in a direction toward the center from the outer peripheral end surface of the substrate, and a set value for L is inputted according to the size, usage, or the like of the substrate W. Normally, an edge cut width C is set in a range of 2 mm to 5 mm. In the case where a rotational speed of the substrate is a certain value or higher at which the amount of liquid migration from the backside to the face is not problematic, the copper film within the edge cut width C can be removed.

Next, a method of cleaning with this cleaning apparatus will be described. First, the semiconductor substrate W is horizontally rotated integrally with the substrate holding portion 922 with the substrate being held horizontally by the spin chucks 921 of the substrate holding portion 922. In this state, an acidic solution is supplied from the center nozzle 924 to the central portion of the face of the substrate W. The acidic solution may be a non-oxidizing acid. For example, hydrofluoric acid, hydrochloric acid, sulfuric acid, citric acid, oxalic acid, or the like is used. On the other hand, an oxidizing agent solution is supplied continuously or intermittently from the edge nozzle 926 to the peripheral edge portion of the substrate W. As the oxidizing agent solution, one of an aqueous solution of ozone, an aqueous solution of hydrogen peroxide, an aqueous solution of nitric acid, and an aqueous solution of sodium hypochlorite is used, or a combination of these is used.

In this manner, the copper film or the like formed on the upper surface and end surface in the region of the edge cut width C at the peripheral edge portion of the semiconductor substrate W is rapidly oxidized with the oxidizing agent solution, and is simultaneously etched with the acidic solution supplied from the center nozzle 924 and spread on the entire face of the substrate, whereby it is dissolved and removed. By mixing the acidic solution and the oxidizing agent solution at the peripheral edge portion of the substrate, a steep etching profile can be obtained, in comparison with a mixture of them which is produced in advance. At that time, the copper etching rate is determined by their concentrations. If a natural oxide film of copper is formed in the circuit-formed portion on the face of the substrate, this natural oxide is immediately removed by the acidic solution spreading on the entire face of the substrate according to rotation of the substrate and does not grow any more. After the supply of the acidic solution from the center nozzle 924 is stopped, the supply of the oxidizing agent solution from the edge nozzle 926 is stopped. As a result, silicon exposed on the surface is oxidized, and deposition of copper can be suppressed.

On the other hand, an oxidizing agent solution and a silicon oxide film etching agent are supplied simultaneously or alternately from the back nozzle 928 to the central portion of the backside of the substrate. Thus, copper or the like adhering in a metal form to the backside of the semiconductor substrate W can be oxidized with the oxidizing agent solution, together with silicon of the substrate, and can be etched and removed with the silicon oxide film etching agent. This oxidizing agent solution is preferably the same as the oxidizing agent solution supplied to the face, because the types of chemicals are decreased in number. Hydrofluoric acid can be used as the silicon oxide film etching agent, and if hydrofluoric acid is also used as the acidic solution on the face of the substrate, the types of chemicals can be decreased in number. Thus, if the supply of the oxidizing agent is stopped first, a hydrophobic surface is obtained. If the etching agent solution is stopped first, a water-saturated surface (a hydrophilic surface) is obtained, and thus the backside surface can be adjusted to a condition which will satisfy the requirements of a subsequent process.

In this manner, the acidic solution, i.e., etching solution is supplied to the substrate to remove metal ions remaining on the surface of the substrate W. Then, pure water is supplied to replace the etching solution with pure water and remove the etching solution, and then the substrate is dried by spin-drying. In this manner, removal of the copper film in the edge cut width C at the peripheral edge portion on the face of the semiconductor substrate, and removal of copper contaminants on the backside are performed simultaneously to thus allow this treatment to be completed, for example, within 80 seconds. While the etching cut width of the edge can be set arbitrarily (from 2 mm to 5 mm), the time required for etching does not depend on the cut width.

Annealing treatment performed before the CMP process and after plating has a favorable effect on the subsequent CMP treatment and on the electrical characteristics of interconnection. Observation of the surface of broad interconnection (unit of several micrometers) after the CMP treatment without annealing showed many defects such as microvoids, which resulted in an increase in the electrical resistance of the entire interconnection. Execution of annealing ameliorated the increase in the electrical resistance. In the presence of annealing, thin interconnections showed no voids. Thus, the degree of grain growth is presumed to be involved in these phenomena. That is, the following mechanism can be speculated: The occurrence of grain growth is difficult in thin interconnections. In broad interconnections, on the other hand, grain growth proceeds in accordance with annealing treatment. During the process of grain growth, ultra-fine pores in the plated film, which are too small to be seen by the SEM (scanning electron microscope), gather and move upward, thus forming microvoid-like depressions in the upper part of the interconnection. The annealing conditions in the annealing unit are such that hydrogen (2% or less) is added in a gas atmosphere, the temperature is in a range of 300° C. to 400° C., and the time is in a range of 1 to 5 minutes. Under these conditions, the above effects were obtained.

Figure 27:
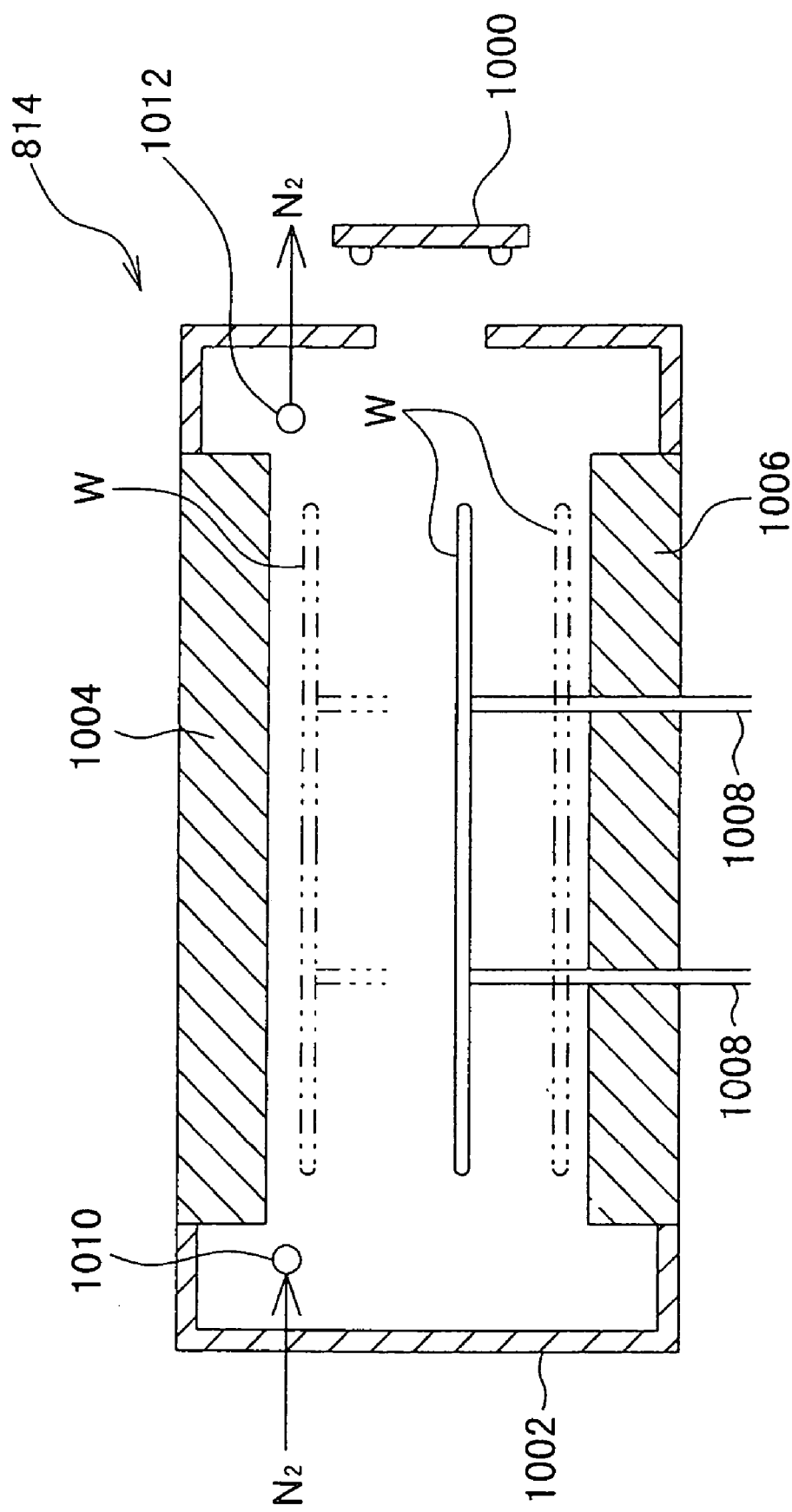
FIG. 27 is a vertical cross-sectional view showing an example of an annealing unit.
Figure 28:
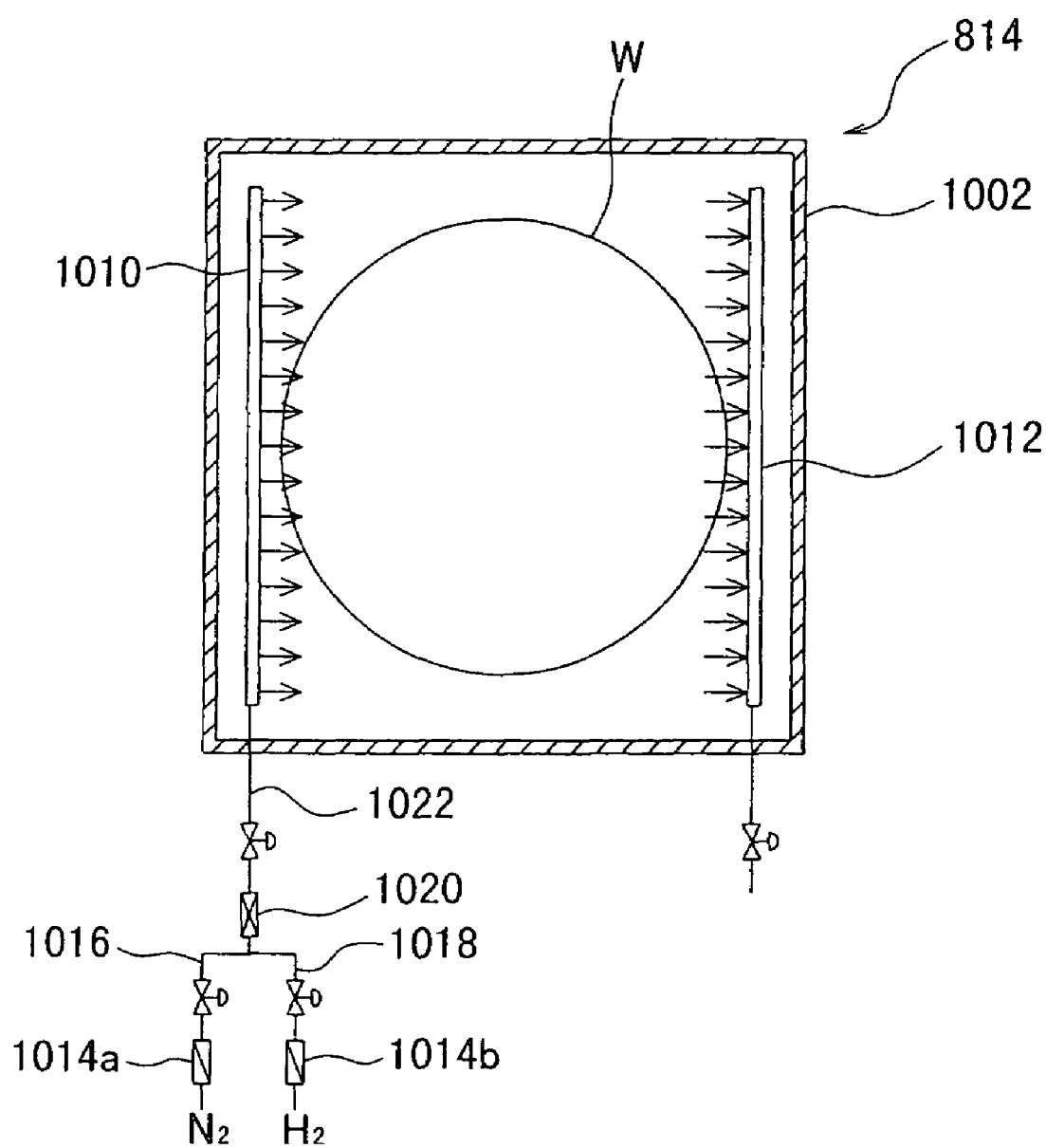
FIG. 28 is a horizontal cross-sectional view of FIG. 27.

FIGS. 27 and 28 show the annealing unit 814. The annealing unit 814 comprises a hot plate 1004 disposed at an upper position in a chamber 1002, which has a gate 1000 for taking in and taking out the semiconductor substrate W, for heating the semiconductor substrate W to e.g. 400° C., and a cool plate 1006 disposed at a lower position in the chamber 1002 for cooling the semiconductor substrate W by, for example, flowing a cooling water inside the plate. A plurality of vertically movable pins 1008 penetrating the cool plate 1006 and extending upward and downward therethrough are vertically movably provided for placing and holding the semiconductor substrate W on an upper end of the pins. A gas introduction pipe 1010 for introducing an antioxidant gas between the semiconductor substrate W and the hot plate 1004 during annealing, and a gas discharge pipe 1012 for discharging the gas which has been introduced from the gas introduction pipe 1010 and flowed between the semiconductor substrate W and the hot plate 1004 are disposed on the opposite sides of the hot plate 1004.

The gas introduction pipe 1010 is connected to a mixed gas introduction line 1022, through which a gas mixed by a mixer 1020 flows, the mixer 1020 mixing a $N_2$ gas introduced through a $N_2$ gas introduction line 1016 having a filter 1014a therein and a $H_2$ gas introduced through a $H_2$ gas introduction line 1018 having a filter 1014b therein.

The semiconductor substrate W, which has been transferred into the chamber 1002 through the gate 1000, is held on the vertically movable pins 1008, and the vertically movable pins 1008 are lifted to a position at which the distance between the semiconductor substrate W held on the vertically movable pins 1008 and the hot plate 1004 becomes e.g. about 0.1–1.0 mm. In this state, the semiconductor substrate W is then heated to e.g. 400° C. through the hot plate 1004 and, at the same time, the antioxidant gas is introduced from the gas introduction pipe 1010 between the semiconductor substrate W and the hot plate 1004 and discharged from the gas discharge pipe 1012. Thus, the semiconductor substrate W is annealed while preventing oxidation, and the annealing treatment is continued for about several tens of seconds to about 60 seconds and then stopped. The heating temperature of the substrate is selected in a range of 100–600° C.

After the completion of the annealing, the vertically movable pins 1008 are lowered to a position at which the distance between the semiconductor substrate W held on the vertically movable pins 1008 and the cool plate 1006 becomes e.g. about 0–0.5 mm. In this state, by introducing a cooling water into the cool plate 1006, the semiconductor substrate W is cooled to a temperature of 100° C. or less in e.g. about 10–60 seconds. The cooled semiconductor substrate is transferred to the next step.

Although a mixed gas in which a $N_2$ gas and a $H_2$ gas of several % are mixed is flowed as the antioxidant gas in this example, only a $N_2$ gas may be flowed.

While the present invention has been described with reference to the preferred embodiments thereof, the present invention is not limited to the above embodiments. It would be apparent to those skilled in the art that many modifications and variations may be made therein without departing from the spirit and scope of the claims, the specification, and the drawings. Any shapes, structures, and materials that have not been disclosed directly in the specification or the drawings can be included in the scope of the present invention as long as they have effects and advantages of the present invention.

For example, in the above embodiments, there has been described an example in which the second treatment liquid supply device 100 is directly mounted on the covering member 80. However, the second treatment liquid supply device 100 may be provided on a portion different from the covering member 80, e.g., an inner surface of the second container 120. The second treatment liquid supply device 100 can have any structure as long as it allows the surface S, to be processed, of the substrate W to be brought into contact with the second treatment liquid in a state in which the opening portion 41 of the container 40 is covered with the covering member 80. With such a structure, since the container 40 is covered with the covering member 80 when the second treatment liquid supply device 100 supplies the second treatment liquid, the second treatment liquid is not introduced into the container 40.

Further, the first treatment liquid and the second treatment liquid are not limited to the chemical liquid and the cleaning liquid used in the above embodiments, and other various kinds of liquids can be used as needed. For example, the first treatment liquid may be a posttreatment liquid for plating, which is used after plating.

In the above embodiments, the container 40 is vertically moved by the driving device. Instead, the substrate holding device 10 may vertically be moved by a driving device, or both of the container 40 and the substrate holding device 10 may vertically be moved by a driving device.

As described above in detail, according to the present invention, treatment of a substrate with a plurality of liquids can reliably be performed in a single chamber without mixing the liquids, and simultaneously it is possible to install the apparatus in a smaller area and realize a lower cost of the apparatus.

What is claimed is:

1. A substrate processing apparatus comprising:
    a substrate holding device for holding a substrate;
    a first container having an opening portion disposed so that said opening portion is opposed to a surface, to be processed, of the substrate;
    a driving device for moving said first container or said substrate holding device between:
        a position at which said first container approaches the substrate or a position at which the substrate enters said first container; and
        a position at which said container is positioned away from the substrate;
    a first treatment liquid supply device for bringing the surface, to be processed, of the substrate, which has approached or entered said first container, into a first treatment liquid;
    a covering member for covering said opening portion of said first container at said position at which said first container is positioned away from the substrate;
    a second treatment liquid supply device for bringing the surface, to be processed, of the substrate into a second treatment liquid in a state in which said opening portion of said first container is covered with said covering member; and
    a second container for holding said second treatment liquid supplied to the surface, to be processed, of the substrate from said second treatment liquid supply device, said second container surrounding said first container.

2. The substrate processing apparatus as defined in claim 1, wherein said second treatment liquid supply device is a second treatment liquid ejecting device mounted on said covering member.

3. The substrate processing apparatus as defined in claim 1, wherein said first treatment liquid is one of a pretreatment liquid for plating, a plating liquid, or a posttreatment liquid for plating.

4. The substrate processing apparatus as defined in claim 1, wherein said second treatment liquid is a cleaning liquid for cleaning said first treatment liquid brought into contact with said surface, to be processed, of the substrate.

5. A substrate processing apparatus comprising:
    a substrate holding device for holding a substrate;
    a container having an opening portion disposed so that said opening portion is opposed to a surface, to be processed, of the substrate;
    a driving device for moving said container or said substrate holding device between:
        a position at which said container approaches the substrate or a position at which the substrate enters said container; and
        a position at which said container is positioned away from the substrate;
    a first treatment liquid supply device for bringing the surface, to be processed, of the substrate, which has approached or entered said container, into a first treatment liquid;
    a covering member for covering said opening portion of said container at said position at which said container is positioned away from the substrate; and
    a second treatment liquid supply device for bringing the surface, to be processed, of the substrate into a second treatment liquid in a state in which said opening portion of said container is covered with said covering member
    wherein said first treatment liquid supply device is one of:
        a first treatment liquid ejecting device for ejecting said first treatment liquid toward the surface, to be processed, of the substrate from a nozzle provided in said container, or
        a first treatment liquid holding device for storing said first treatment liquid in said container and immersing the surface, to be processed, of the substrate in said first treatment liquid.

6. The substrate processing apparatus as defined in claim 5, wherein said second treatment liquid supply device is a second treatment liquid ejecting device mounted on said covering member.

7. The substrate processing apparatus as defined in claim 5, wherein said first treatment liquid is one of a pretreatment liquid for plating, a plating liquid, or a posttreatment liquid for plating.

8. The substrate processing apparatus as defined in claim 5, wherein said second treatment liquid is a cleaning liquid for cleaning said first treatment liquid brought into contact with said surface, to be processed, of the substrate.

9. A substrate processing apparatus comprising:
a substrate holding device for holding a substrate;
a container having an opening portion disposed so that said opening portion is opposed to a surface, to be processed, of the substrate;
a driving device for moving said container or said substrate holding device between:
- a position at which said container approaches the substrate or a position at which the substrate enters said container; and
- a position at which said container is positioned away from the substrate;

a first treatment liquid supply device for bringing the surface, to be processed, of the substrate, which has approached or entered said container, into a first treatment liquid;
a covering member for covering said opening portion of said container at said position at which said container is positioned away from the substrate;
a second treatment liquid supply device for bringing the surface, to be processed, of the substrate into a second treatment liquid in a state in which said opening portion of said container is covered with said covering member; and
a swinging device for swingably driving said covering member, said swinging device being provided on said covering member; and
said driving device is a mechanism for moving said container, and is arranged as a mechanism for stopping said container at three positions including a first position at which said container approaches the substrate or the substrate enters said container, a second position at which said container is positioned away from the substrate and is covered with said covering member, and a third position at which said container is further lowered.

* * * * *